US010943947B2

(12) United States Patent
Im et al.

(10) Patent No.: US 10,943,947 B2
(45) Date of Patent: Mar. 9, 2021

(54) DISPLAY DEVICE AND METHOD FOR FABRICATING THE SAME

(71) Applicant: SAMSUNG DISPLAY CO., LTD., Yongin-si (KR)

(72) Inventors: Hyundeok Im, Seoul (KR); Jonghyuk Kang, Suwon-si (KR); Daehyun Kim, Hwaseong-si (KR); Jooyeol Lee, Seoul (KR); Hyunmin Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 27 days.

(21) Appl. No.: 16/282,122

(22) Filed: Feb. 21, 2019

(65) Prior Publication Data
US 2019/0326348 A1    Oct. 24, 2019

(30) Foreign Application Priority Data
Apr. 18, 2018    (KR) .................. 10-2018-0044963

(51) Int. Cl.
*H01L 29/18* (2006.01)
*H01L 27/15* (2006.01)
(Continued)

(52) U.S. Cl.
CPC ............ *H01L 27/156* (2013.01); *G09G 3/32* (2013.01); *H01L 25/0753* (2013.01);
(Continued)

(58) Field of Classification Search
CPC ... H01L 27/156; H01L 25/0753; H01L 33/62; H01L 2933/0066; H01L 25/167; G09G 3/32; H05K 2201/10106; G09F 9/33
See application file for complete search history.

(56) References Cited

U.S. PATENT DOCUMENTS 9,570,425 B2    2/2017  Do
9,773,761 B2    9/2017  Do
(Continued)

FOREIGN PATENT DOCUMENTS

EP         3 270 413 A1     1/2018
JP      WO2017/094461 A1    6/2017
(Continued)

OTHER PUBLICATIONS

Extended European Search Report for corresponding European Patent Application No. 19170330.5, dated Aug. 29, 2019, 10 pages.

*Primary Examiner* — Robert G Bachner
(74) *Attorney, Agent, or Firm* — Lewis Roca Rothgerber Christie LLP

(57) ABSTRACT

A display device and a method of manufacturing a display device are provided. A display device includes: a substrate; a switching element on the substrate; a first insulating layer on the switching element; a first alignment electrode and a second alignment electrode disposed on the first insulating layer so as to face each other; a second insulating layer on the first alignment electrode and the second alignment electrode; a first driving electrode on the second insulating layer and connected to the switching element; a second driving electrode disposed on the second insulating layer so as to face the first driving electrode; and a light emitting element between the first driving electrode and the second driving electrode, and a distance between the first alignment electrode and the second alignment electrode is less than a distance between the first driving electrode and the second driving electrode.

22 Claims, 34 Drawing Sheets

(51) Int. Cl.
*G09G 3/32* (2016.01)
*H01L 25/075* (2006.01)
*H01L 33/62* (2010.01)

(52) U.S. Cl.
CPC ...... *H01L 33/62* (2013.01); *H01L 2933/0066* (2013.01); *H05K 2201/10106* (2013.01)

(56) References Cited

U.S. PATENT DOCUMENTS

| | | |
|---|---|---|
| 2007/0152537 A1 | 7/2007 | Yamaguchi et al. |
| 2017/0250168 A1 | 8/2017 | Do et al. |
| 2017/0358563 A1 | 12/2017 | Cho et al. |
| 2018/0358339 A1* | 12/2018 | Iguchi ................ H01L 25/0753 |

FOREIGN PATENT DOCUMENTS

| | | |
|---|---|---|
| KR | 10-1436123 | 11/2014 |
| KR | 10-1490758 | 1/2015 |
| KR | 2017-0141305 | 12/2017 |

* cited by examiner

DISPLAY DEVICE AND METHOD FOR FABRICATING THE SAME

CROSS-REFERENCE TO RELATED APPLICATION

This application claims priority to and the benefit of Korean Patent Application No. 10-2018-0044963, filed on Apr. 18, 2018 in the Korean Intellectual Property Office, the entire disclosure of which is incorporated by reference herein.

BACKGROUND

1. Field

Aspects of embodiments of the present invention relate to a display device and a method of manufacturing the display device.

2. Discussion of Related Art

Light emitting elements, e.g., light emitting diodes (herein, "LEDs"), have high light conversion efficiency, very low energy consumption, and are semi-permanent and environmentally friendly. Accordingly, the LEDs are utilized in many fields, such as traffic lights, mobile phones, automobile headlights, outdoor electric signboards, backlights, and indoor/outdoor lights.

Recently, display devices utilizing nano-sized LEDs as the light emitting elements have been studied.

Meanwhile, in order for the nano-LED to emit light normally, the nano-LED and driving electrodes should be in proper contact with each other. To this end, the nano-LEDs are required to be accurately aligned. That is, when the nano-LEDs are not accurately aligned, the nano-LEDs and the driving electrodes may not contact each other, and, thus, the nano-LEDs may not emit light.

It is to be understood that this background of the technology section is intended to provide useful background for understanding the technology and, as such, disclosed herein, the technology background section may include ideas, concepts, or recognitions that were not part of what was known or appreciated by those skilled in the pertinent art prior to a corresponding effective filing date of subject matter disclosed herein.

SUMMARY

According to an aspect of embodiments of the present invention, a display device is capable of improving the degree of alignment of light emitting elements, such as nano-LEDs, and a method of manufacturing the display device is provided.

According to one or more embodiments, a display device includes: a substrate; a switching element on the substrate; a first insulating layer on the switching element; a first alignment electrode and a second alignment electrode arranged on the first insulating layer so as to face each other; a second insulating layer on the first alignment electrode and the second alignment electrode; a first driving electrode on the second insulating layer and connected to the switching element; a second driving electrode arranged on the second insulating layer so as to face the first driving electrode; and a light emitting element between the first driving electrode and the second driving electrode, and a distance between the first alignment electrode and the second alignment electrode is less than a distance between the first driving electrode and the second driving electrode.

A first side surface of the first alignment electrode and a second side surface of the second alignment electrode that faces the first side surface may overlap an area between the first driving electrode and the second driving electrode.

The first side surface and the second side surface may overlap the light emitting element.

A first side surface and a second side surface of the light emitting element may face each other, and the first side surface of the light emitting element may overlap the first side surface of the first alignment electrode.

The second side surface of the light emitting element may overlap the second side surface of the second alignment electrode.

The distance between the first alignment electrode and the second alignment electrode may be equal to or less than a length of the light emitting element.

The first driving electrode may overlap the first alignment electrode, and the second driving electrode may overlap the second alignment electrode.

The first alignment electrode may be connected to the switching element, the first driving electrode, and a first electrode of the light emitting element.

The display device may further include a driving power line connected to the second alignment electrode.

The driving power line may be connected to the second driving electrode and a second electrode of the light emitting element.

The display device may further include an alignment line connected to the first alignment electrode.

The alignment line may have a non-continuous line shape.

The display device may further include a first driving power line connected to the first alignment electrode; and a second driving power line connected to the second alignment electrode, and a voltage of the second driving power line may be lower than a voltage of the first driving power line.

The light emitting element may include a nano-light emitting element.

According to one or more embodiments, a display device includes: a substrate; a switching element on the substrate; a first insulating layer on the switching element; an alignment electrode on the first insulating layer; a second insulating layer on the alignment electrode; a first driving electrode on the second insulating layer and connected to the switching element; a second driving electrode arranged on the second insulating layer so as to face the first driving electrode; and a light emitting element between the first driving electrode and the second driving electrode, and facing side surfaces of the alignment electrode overlap an area between the first driving electrode and the second driving electrode.

A distance between the facing side surfaces of the alignment electrode may be less than a distance between the first driving electrode and the second driving electrode.

A distance between the facing side surfaces of the alignment electrode may be equal to or larger than a distance between facing side surfaces of the light emitting element.

According to one or more embodiments, a method of manufacturing a display device includes: forming a switching element on a substrate; forming a first insulating layer on the switching element; forming a first alignment electrode and a second alignment electrode that face each other on the first insulating layer; forming a second insulating layer on the first alignment electrode and the second alignment electrode; forming a first driving electrode and a second driving electrode that face each other on the second insulating layer; forming a light emitting element between the first driving electrode and the second driving electrode; and applying a first alignment signal to the first alignment electrode, and applying a second alignment signal to the second alignment electrode, and a first side surface of the first alignment electrode and a second side surface of the second alignment electrode that faces the first side surface overlap an area between the first driving electrode and the second driving electrode.

The second alignment signal may be a DC voltage, and the first alignment signal may be an AC signal having a high voltage and a low voltage alternately, the high voltage being higher than the second alignment signal, and the low voltage being lower than the second alignment signal.

The method may further include: forming an alignment line on the first insulating layer, the alignment line connected to the first alignment electrode; and disconnecting a part of the alignment line after applying the first alignment signal and the second alignment signal.

The foregoing is illustrative only and is not intended to be in any way limiting of the present invention. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the present invention will become more apparent by describing in further detail some embodiments thereof with reference to the accompanying drawings, wherein.

DETAILED DESCRIPTION

Figure 1:
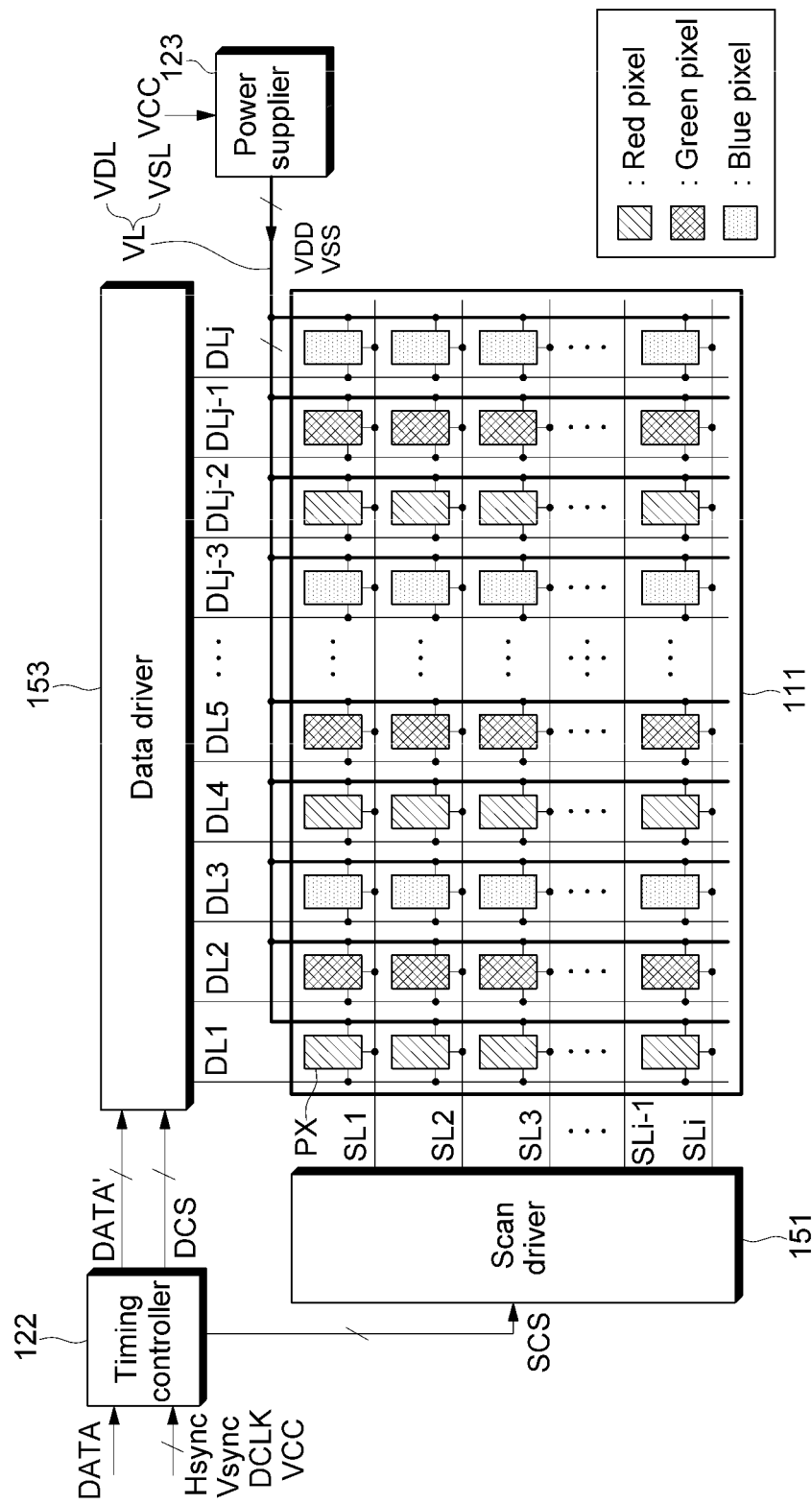
FIG. 1 is a view illustrating a display device according to an embodiment of the present invention.

Some embodiments will now be described more fully herein with reference to the accompanying drawings. Although the present invention may be modified in various manners and have several embodiments, some embodiments are illustrated in the accompanying drawings and will be mainly described in the specification. However, the scope of the invention is not limited to the described embodiments and should be construed as including all changes, equivalents, and substitutions included in the spirit and scope of the invention.

In the drawings, thicknesses of a plurality of layers and areas may be illustrated in an enlarged manner for clarity and ease of description thereof. When a layer, area, or plate is referred to as being "on" another layer, area, or plate, it may be directly on the other layer, area, or plate or one or ore intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or one or more intervening layers, areas, or plates may be present therebetween. Conversely, when a layer, area, or plate is referred to as being "directly below" another layer, area, or plate, intervening layers, areas, or plates may be absent therebetween.

The spatially relative terms "below," "beneath," "lower," "above," "upper," and the like, may be used herein for ease of description to describe the relations between one element or component and another element or component as illustrated in the drawings. It is to be understood that the spatially relative terms are intended to encompass different orientations of the device in use or operation, in addition to the orientation depicted in the drawings. For example, in the case in which a device illustrated in the drawing is turned over, the device located "below" or "beneath" another device may be placed "above" another device. Accordingly, the illustrative term "below" may include both the lower and upper positions. The device may also be oriented in the other direction and, thus, the spatially relative terms may be interpreted differently depending on the orientations.

Throughout the specification, when an element is referred to as being "connected" to another element, the element may be "directly connected" to the other element, or "electrically connected" to the other element with one or more intervening elements interposed therebetween. It is to be further understood that the terms "comprises," "including," "includes," and/or "including," when used in this specification, specify the presence of stated features, integers, steps, operations, elements, and/or components, but do not preclude the presence or addition of one or more other features, integers, steps, operations, elements, components, and/or groups thereof.

It is to be understood that, although the terms "first," "second," "third," and the like may be used herein to describe various elements, these elements should not be limited by these terms. These terms are used to distinguish one element from another element. Thus, "a first element" discussed below could be termed "a second element" or "a third element," and "a second element" and "a third element" may be termed likewise without departing from the teachings herein.

"About" or "approximately" as used herein are inclusive of the stated value and mean within an acceptable range of variation for the particular value as determined by one of ordinary skill in the art, considering the measurement in question and the error associated with measurement of the particular quantity (e.g., the limitations of the measurement system). For example, "about" may mean within one or more standard variations, or within ±30%, 20%, 10%, or 5% of the stated value.

Unless otherwise defined, all terms used herein (including technical and scientific terms) have the same meaning as commonly understood by those skilled in the art to which this invention pertains. It is to be further understood that terms, such as those defined in commonly used dictionaries, should be interpreted as having a meaning that is consistent with their meaning in the context of the relevant art and are not to be interpreted in an ideal or excessively formal sense unless clearly defined in the present specification.

Some of the parts which are not associated with the description may not be described in describing embodiments of the present invention, and like reference numerals refer to like elements throughout the specification.

Herein, a display device according to some embodiments of the present invention and a method of manufacturing the display device will be described in further detail with reference to FIGS. 1 to 23.

FIG. 1 is a view illustrating a display device according to an embodiment of the present invention.

A display device according to an embodiment of the present invention includes a display panel 111, a scan driver 151, a data driver 153, a timing controller 122, and a power supplier 123, as illustrated in FIG. 1.

The display panel 111 includes a plurality of pixels PX; and a plurality of scan lines SL1 to SLi, a plurality of data lines DL1 to DLj, and a power line VL for transmitting various signals required for the pixels PX to display images, where i is a natural number greater than 2, and j is a natural number greater than 3. The power line VL includes a first driving power line VDL and a second driving power line VSL which are electrically separated from each other.

The pixels PX are disposed at the display panel 111 in a matrix form.

Each pixel PX includes at least one light emitting element, e.g., light emitting diode (herein, "LED"). In such a case, at least two of the entire pixels (e.g., "i*j" number of pixels) may include different numbers of LEDs. For example, if one pixel includes "a" number of LEDs, another pixel may include "b" number of LEDs, where a and b are natural numbers different from each other.

In an embodiment, the pixels PX include a red pixel for displaying red, a green pixel for displaying green, and a blue pixel for displaying blue.

The red pixel includes at least one red LED emitting red light, the green pixel includes at least one green LED emitting green light, and the blue pixel includes at least one blue LED emitting blue light. In an exemplary embodiment, one pixel does not necessarily include at least one LED. For example, each of the red pixel, the green pixel, and the blue pixel may include a red LED and a blue LED. In such a case, the red pixel, the green pixel, and the blue pixel may further include color conversion layers located on the LED.

In an embodiment, a system (not illustrated) outside the display panel 111 outputs a vertical synchronization signal Vsync, a horizontal synchronization signal Hsync, a clock signal DCLK, a power signal VCC, and image data signals DATA through an interface circuit by using a low voltage differential signaling (LVDS) transmitter of a graphic controller. The vertical synchronization signal Vsync, the horizontal synchronization signal Hsync, the clock signal DCLK, and the power signal VCC output from the system are applied to the timing controller 122. In addition, the image data signals DATA sequentially output from the system are applied to the timing controller 122.

The timing controller 122 generates a data control signal DCS and a scan control signal SCS based on the horizontal synchronization signal Hsync, the vertical synchronization signal Vsync, and the clock signal DCLK input to the timing controller 122 and provides the data control signal DCS and the scan control signal SCS to the data driver 153 and the scan driver 151, respectively. The data control signal DCS is applied to the data driver 153, and the scan control signal SCS is applied to the scan driver 151.

The data control signal DCS includes a dot clock signal, a source shift clock signal, a source enable signal, and a polarity inversion signal.

The scan control signal SCS includes a gate start pulse, a gate shift clock signal, and a gate output enable signal.

The data driver 153 samples image data signals DATA' according to the data control signal DCS applied from the timing controller 122, latches the sampled image data signals corresponding to one horizontal line in each horizontal time (1H, 2H, . . . ), and applies the latched image data signals to the data lines DL1 to DLj. That is, in an embodiment, the data driver 153 converts the image data signal applied from the timing controller 122 into an analog signal using a gamma voltage input from the power supplier 123, and applies the converted analog signals to the data lines DL1 to DLj.

The scan driver 151 includes a shift register that generates scan signals in response to the gate start pulse applied from the timing controller 122 and a level shifter that shifts the scan signals to a voltage level suitable for driving the pixel PX. The scan driver 151 applies first to i-th scan signals to the scan lines SL1 to SLi, respectively, in response to the scan control signal SCS applied from the timing controller 122.

The power supplier 123 generates the plurality of gamma voltage, a first driving voltage VDD, and a second driving voltage VSS using the power signal VCC. The power supplier 123 applies the plurality of gamma voltage to the data driver 153, applies the first driving voltage VDD to the first driving power line VDL, and applies the second driving voltage VSS to the second driving power line VSL.

Figure 2:
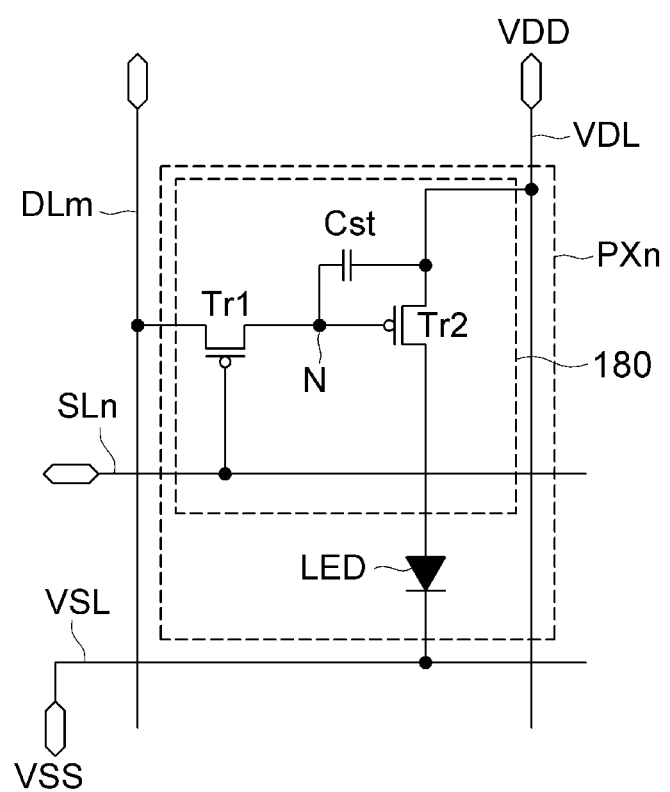
FIG. 2 is a circuit diagram illustrating one of pixels illustrated in FIG. 1.

FIG. 2 is a circuit diagram illustrating one of pixels illustrated in FIG. 1.

A pixel PX includes a pixel circuit 180 and an LED receiving a driving current from the pixel circuit 180, as illustrated in FIG. 2.

The pixel circuit 180 may include a first switching element Tr1, a second switching element Tr2, and a storage capacitor Cst.

The first switching element Tr1 includes a first gate electrode connected to an n-th scan line SLn, and is connected between an m-th data line DLm and a node N. One of a first drain electrode and a first source electrode of the first switching element Tr1 is connected to the m-th data line DLm, and the other of the first drain electrode and the first source electrode of the first switching element Tr1 is connected to the node N. For example, the first source electrode of the first switching element Tr1 is connected to the m-th data line DLm, and the first drain electrode of the first switching element Tr1 is connected to the node N, where n and m each are a natural number.

The second switching element Tr2 includes a second gate electrode connected to the node N, and is connected between the first driving power line VDL and the LED. One of a second drain electrode and a second source electrode of the second switching element Tr2 is connected to the first driving power line VDL, and the other of the second drain electrode and the second source electrode of the second switching element Tr2 is connected to the LED. For example, the second source electrode of the second switching element Tr2 is connected to the first driving power line VDL, and the second drain electrode of the second switching element Tr2 is connected to the LED.

The second switching element Tr2 is a driving switching element for driving the LED, and the second switching element Tr2 adjusts an amount (density) of the driving current applied from the first driving power line VDL to the second driving power line VSL according to the magnitude of the data signal applied to the second gate electrode of the second switching element Tr2.

The storage capacitor Cst is connected between the node N and the first driving power line VDL. The storage capacitor Cst stores the signal applied to the second gate electrode of the second switching element Tr2 for one frame period.

The LED is connected between the second drain electrode of the second switching element Tr2 and the second driving power line VSL. The LED emits light in accordance with the driving current applied through the second switching element Tr2. The LED emits light of different brightness depending on the magnitude of the driving current.

Figure 3:
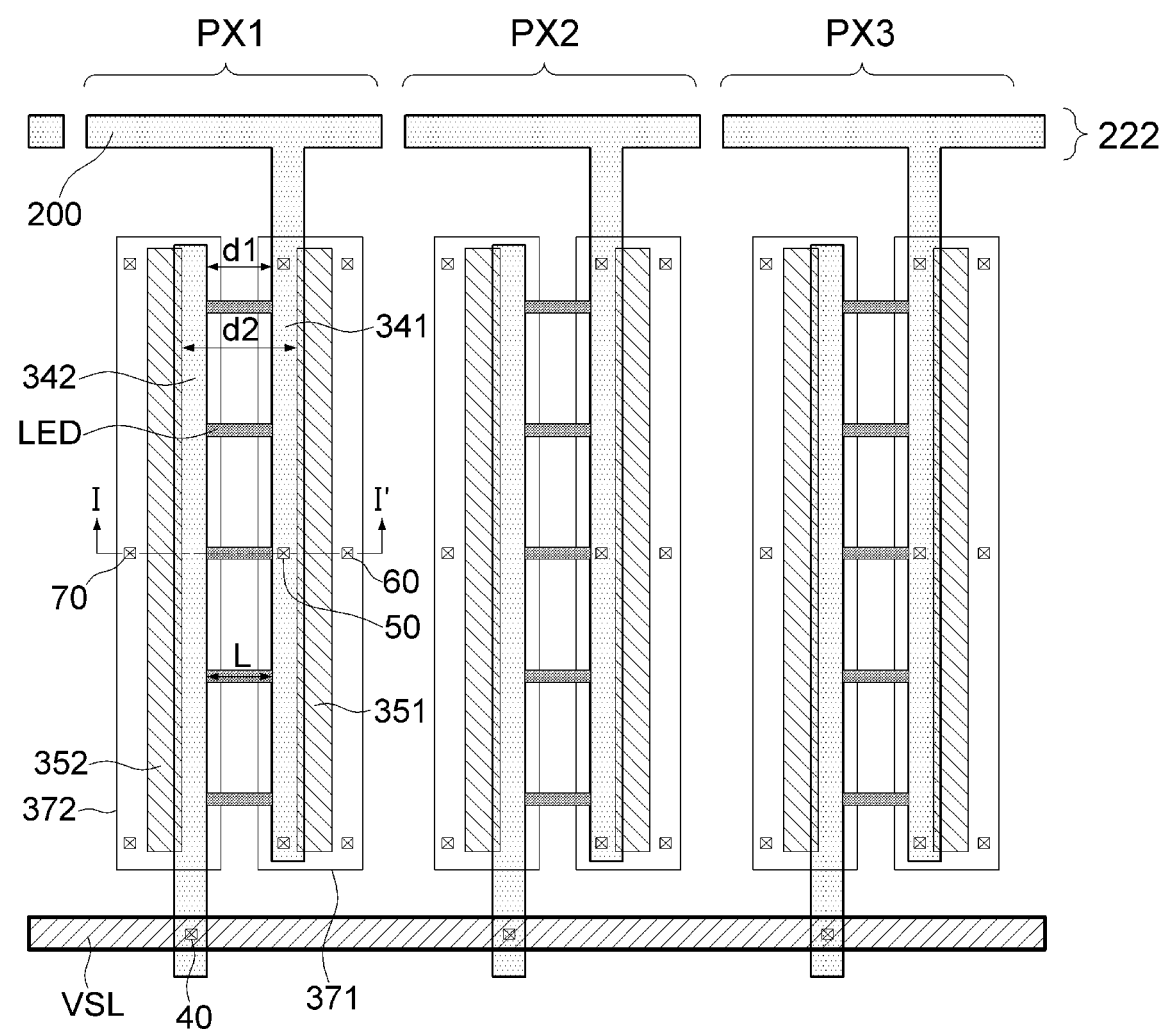
FIG. 3 is a plan view illustrating three adjacent pixels of FIG. 1.
Figure 4:
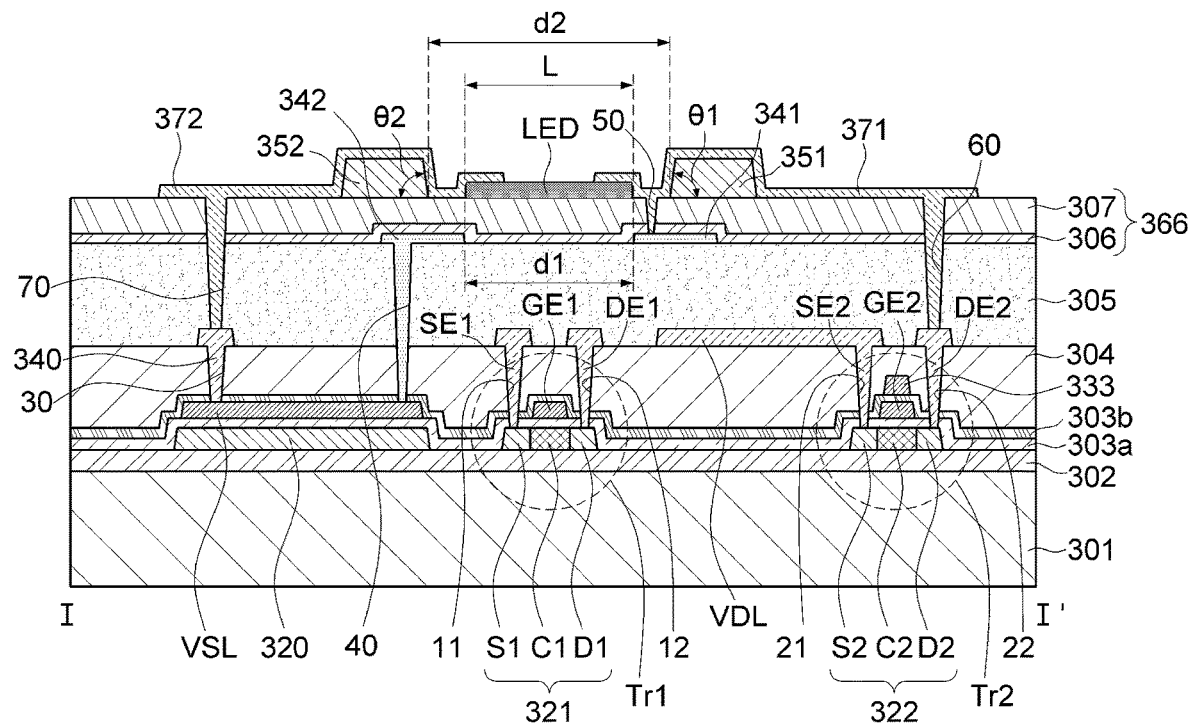
FIG. 4 is a cross-sectional view taken along the line I-I' of FIG. 3.

FIG. 3 is a plan view illustrating three adjacent pixels of FIG. 1; and FIG. 4 is a cross-sectional view taken along the line I-I' of FIG. 3.

As illustrated in FIGS. 3 and 4, in an embodiment, a display device includes a substrate 301, a buffer layer 302, a dummy layer 320, a first switching element Tr1, a second switching element Tr2, a first gate insulating layer 303a, a second driving power line VSL, a second gate insulating layer 303b, a storage electrode 333, an insulating interlayer 304, a first driving power line VDL, a planarization layer 305, an insulating layer 366, a first alignment electrode 341, a second alignment electrode 342, a first driving electrode 351, a second driving electrode 352, an LED, a first connection electrode 371, and a second connection electrode 372.

In an embodiment, the substrate 301 may be any one of a glass substrate, a quartz substrate, a sapphire substrate, a plastic substrate, and a flexible polymer film that is bendable.

The first switching element Tr1 includes a first semiconductor layer 321, a first gate electrode GE1, a first source electrode SE1, and a first drain electrode DE1.

The second switching element Tr2 includes a second semiconductor layer 322, a second gate electrode GE2, a second source electrode SE2, and a second drain electrode DE2.

The buffer layer 302 is located on the substrate 301. In an embodiment, the buffer layer 302 overlaps the entire surface of the substrate 301. The buffer layer 302 may serve to prevent or substantially prevent impurity ions from being diffused on the upper surface of the substrate 301, prevent or substantially prevent penetration of moisture or outside air, and flatten the surface.

The buffer layer 302 may include an inorganic material, such as any of silicon oxide, silicon nitride, silicon oxynitride, aluminum oxide, aluminum nitride, titanium oxide, and titanium nitride, an organic material, such as any of polyimide, polyester, and acryl, or a laminated structure thereof. In an embodiment, the buffer layer 302 may be omitted.

The first semiconductor layer 321, the second semiconductor layer 322, and the dummy layer 320 are located on the buffer layer 302.

The first semiconductor layer 321 may include an inorganic semiconductor, such as amorphous silicon or polysilicon, or an organic semiconductor. The second semiconductor layer 322 may include a material substantially the same as a material included in the first semiconductor layer 321.

In an exemplary embodiment, the second semiconductor layer 322 may include an oxide semiconductor. For example, the oxide semiconductor may include an oxide based on a Group 12, 13, or 14 metal element, such as any of zinc (Zn), indium (In), gallium (Ga), tin (Sn), cadmium (Cd), germanium (Ge), and hafnium (Hf), or a combination thereof.

The first gate insulating layer 303a is located on the first semiconductor layer 321, the second semiconductor layer 322 and the buffer layer 302. In an embodiment, the first gate insulating layer 303a overlaps the entire surface of the substrate 301.

The first gate insulating layer 303a may include an inorganic layer including an inorganic material, such as any of silicon oxide, silicon nitride, and metal oxide.

The first gate electrode GE1, the second gate electrode GE2, and the second driving power line VSL are located on the first gate insulating layer 303a. In an embodiment, the first gate electrode GE1 is located on the first gate insulating layer 303a so as to overlap a channel area C1 of the first semiconductor layer 321, the second gate electrode GE2 is located on the first gate insulating layer 303a so as to overlap a channel area C2 of the second semiconductor layer 322, and the second driving power line VSL is located on the first gate insulating layer 303a so as to overlap the dummy layer 320. Although not illustrated, the first gate electrode GE1 is connected to a scan line (e.g., a scan line SLn).

The first gate electrode GE1 may include a material such as any of Au, Ag, Cu, Ni, Pt, Pd, Al, Mo, Cr, Al:Nd and Mo:W. The second gate electrode GE2 and the second driving power line VSL may include a material substantially the same as a material included in the first gate electrode GE1.

The second gate insulating layer 303b is located on the first gate electrode GE1, the second gate electrode GE2, the second driving power line VSL, and the first gate insulating layer 303a. In an embodiment, the second gate insulating layer 303b overlaps the entire surface of the substrate 301.

The second gate insulating layer 303b may include a material substantially the same as a material included in the first gate insulating layer 303a.

The storage electrode 333 is located on the second gate insulating layer 303b. The storage electrode 333 is located on the second gate insulating layer 303b so as to overlap the second gate electrode GE2. The storage capacitor Cst is located between the storage electrode 333 and the second gate electrode GE2. The storage electrode 333 is connected to the first driving power line VDL through a contact hole (not illustrated) defined through the insulating interlayer 304.

The storage electrode 333 may include a material substantially the same as a material included in the first gate electrode GE1.

The insulating interlayer 304 is located on the storage electrode 333 and the second gate insulating layer 303b. In an embodiment, the insulating interlayer 304 overlaps the entire surface of the substrate 301.

The insulating interlayer 304 may include an inorganic layer including an inorganic material, such as silicon oxide or silicon nitride. In an exemplary embodiment, the insulating interlayer 304 may include an organic layer.

The first source electrode SE1, the first drain electrode DE1, the second source electrode SE2, the second drain electrode DE2, an extension electrode 340, and the first driving power line VDL are located on the insulating interlayer 304.

The first source electrode SE1 is connected to a first source area S1 of the first semiconductor layer 321 through a first source contact hole 11 defined through the insulating interlayer 304, the second gate insulating layer 303b, and the first gate insulating layer 303a. Although not illustrated, the first source electrode SE1 is connected to a data line (e.g., a data line DLm).

The first source electrode SE1 may include metal, metal alloy, metal nitride, conductive metal oxide, a transparent conductive material, or the like.

The first drain electrode DE1 is connected to a first drain area D1 of the first semiconductor layer 321 through a first drain contact hole 12 defined through the insulating interlayer 304, the second gate insulating layer 303b, and the first gate insulating layer 303a. Although not illustrated, the first drain electrode DE1 is connected to the second gate electrode GE2 through a contact hole defined through the insulating interlayer 304 and the second gate insulating layer 303b.

The second source electrode SE2 is connected to a second source area S2 of the second semiconductor layer 322 through a second source contact hole 21 defined through the insulating interlayer 304, the second gate insulating layer 303b, and the first gate insulating layer 303a. The second source electrode SE2 is connected to the first driving power line VDL.

The second drain electrode DE2 is connected to a second drain area D2 of the second semiconductor layer 322 through a second drain contact hole 22 defined through the insulating interlayer 304, the second gate insulating layer 303b, and the first gate insulating layer 303a.

The extension electrode 340 is connected to the second driving power line VSL through a contact hole 30 defined through the insulating interlayer 304 and the second gate insulating layer 303b.

In an embodiment, the first drain electrode DE1, the second source electrode SE2, the second drain electrode DE2, the extension electrode 340 and the first driving power line VDL may include a material substantially the same as a material included in the first source electrode SE1.

The planarization layer 305 is located on the first source electrode SE1, the first drain electrode DE1, the second source electrode SE2, the second drain electrode DE2, the extension electrode 340, and the insulating interlayer 304. The planarization layer 305 may serve to eliminate or substantially eliminate the height difference between layers and planarize layers therebelow in order to improve luminous efficiency of the LED.

The planarization layer 305 may include an insulator. For example, the planarization layer 305 may include a single- or multiple-layer structure including an inorganic material, an organic material, or an organic/inorganic composite. In an embodiment, the planarization layer 305 may include at least one of: a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

The first alignment electrode 341, the second alignment electrode 342, and an alignment line 222 are located on the planarization layer 305.

The first alignment electrode 341 is connected to the alignment line 222. For example, the first alignment electrode 341 and the alignment line 222 may be unitarily formed.

As illustrated in FIG. 3, the first alignment electrode 341 extends along a Y-axis direction, and the alignment line 222 extends along an X-axis direction.

In an embodiment, the alignment line 222 has a non-continuous line shape. For example, the alignment line 222 may include a plurality of divided electrodes 200 separated from each other. Each of the divided electrodes 200 is connected to the first alignment electrode 341 of each of the pixels PX1, PX2, and PX3. As a more specific example, as illustrated in FIG. 3, three divided electrodes 200 are connected to respective first alignment electrodes 341 of first, second, and third pixels PX1, PX2, and PX3, respectively.

The second alignment electrode 342 is connected to the second driving power line VSL through a contact hole 40 defined through the planarization layer 305, the insulating interlayer 304, and the second gate insulating layer 303b.

In an embodiment, the first alignment electrode 341 may include a material substantially the same as a material included in the first gate electrode GE1. In addition, the first alignment electrode 341 may include metal having a relatively high reflectance. For example, the first alignment electrode 341 may include aluminum or an aluminum alloy. The second alignment electrode 342 may include a material substantially the same as a material included in the first alignment electrode 341.

The insulating layer 366 is located on the first alignment electrode 341, the second alignment electrode 342, and the planarization layer 305. In an embodiment, the insulating layer 366 may include a plurality of insulating layers 306 and 307 disposed along a Z-axis direction. For example, the insulating layer 366 may include a first insulating layer 306 and a second insulating layer 307 disposed along the Z-axis direction.

The first insulating layer 306 is located on the first alignment electrode 341, the second alignment electrode 342, and the planarization layer 305. In an embodiment, the first insulating layer 306 is located between the planarization layer 305 and the second insulating layer 307, between the first alignment electrode 341 and the second insulating layer 307, and between the second alignment electrode 342 and the second insulating layer 307.

In an embodiment, the first insulating layer 306 may include a material substantially the same as a material included in the first gate insulating layer 303a or the insulating interlayer 304.

The second insulating layer 307 is located on the first insulating layer 306.

In an embodiment, the second insulating layer 307 may include a material substantially the same as a material included in the first insulating layer 306.

The first driving electrode 351 and the second driving electrode 352 are located on the second insulating layer 307. The first driving electrode 351 may be located on the second insulating layer 307 so as to overlap the first alignment electrode 341, and the second driving electrode 352 may be located on the second insulating layer 307 so as to overlap the second alignment electrode 342.

The first driving electrode 351 and the second driving electrode 352 face each other in the X-axis direction with the LED interposed therebetween.

When one surface of the first driving electrode 351 that faces the second driving electrode 352 is defined as a first side surface, one surface of the second driving electrode 352 that faces the first side surface is defined as a second side surface, and surfaces of the first driving electrode 351 and the second driving electrode 352 in contact with the second insulating layer 307 are defined as lower surfaces of the corresponding driving electrodes, respectively, an angle θ1 formed between the first side surface and the lower surface of the first driving electrode 351 is an acute angle. Similarly, an angle θ2 formed between the second side surface and the lower surface of the second driving electrode 352 is an acute angle.

An angle formed between a surface of the first driving electrode 351 opposite to the first side surface and the lower surface of the first driving electrode 351 is an acute angle, and an angle formed between a surface of the second driving electrode 352 opposite to the second side surface and the lower surface of the second driving electrode 352 is an acute angle.

A distance d2 between the first driving electrode 351 and the second driving electrode 352 may be different from a distance d1 between the first alignment electrode 341 and the second alignment electrode 342. In an embodiment, the distance d1 between the first alignment electrode 341 and the second alignment electrode 342 may be less than the distance d2 between the first driving electrode 351 and the second driving electrode 352. In another exemplary embodiment, the distance d1 between the first alignment electrode 341 and the second alignment electrode 342 may be equal (equal or substantially equal) to the distance d2 between the first driving electrode 351 and the second driving electrode 352.

In an embodiment, the first driving electrode 351 and the second driving electrode 352 may include a material substantially the same as a material included in the first gate electrode GE1.

The LED is located on the second insulating layer 307, and the LED may be located between the first driving electrode 351 and the second driving electrode 352 on the second insulating layer 307.

A length L of the LED may be equal (equal or substantially equal) to the distance dl between the first alignment electrode 341 and the second alignment electrode 342 described above.

Opposite side surfaces (or opposite end portions) of the LED that face each other in the X-axis direction may be located corresponding to the side surface (or end portion) of the first alignment electrode 341 and the side surface (or end portion) of the second alignment electrode 342, respectively. For example, when one surface of the LED that is connected to the first connection electrode 371 is defined as a third side surface, another surface of the LED that is connected to the second connection electrode 372 is defined as a fourth side surface, one surface of the first alignment electrode 341 that faces the second alignment electrode 342 is defined as a fifth side surface, and one surface of the second alignment electrode 342 that faces the fifth side surface is defined as a sixth side surface, the third side surface of the LED is located corresponding to the fifth side surface of the first alignment electrode 341, and the fourth side surface of the LED is located corresponding to the sixth side surface of the second alignment electrode 342. In other words, the third side surface may overlap the fifth side surface, and the fourth side surface may overlap the sixth side surface.

In an embodiment, the fifth side surface of the first alignment electrode 341 and the sixth side surface of the second alignment electrode 342 overlap with the area between the first driving electrode 351 and the second driving electrode 352. For example, the fifth side surface may overlap with the area between the first side surface and the third side surface, and the sixth side surface may overlap with the area between the second side surface and the fourth side surface Since the distance dl between the first alignment electrode 341 and the second alignment electrode 342 is less than the distance d2 between the first driving electrode 351 and the second driving electrode 352, and facing side surfaces (i.e., the fifth side surface and the sixth side surface) of the first alignment electrode 341 and the second alignment electrode 342 are located in the area (e.g., pixel area) between the first driving electrode 351 and the second driving electrode 352, the LED may be properly aligned in the pixel area.

In addition, the light emitted from the opposite side surfaces (i.e., the third side surface and the fourth side surface) of the LED may be incident to the first alignment electrode 341 and the second alignment electrode 342 and reflected in the Z-axis direction, and, accordingly, the luminous efficiency may be improved.

The first connection electrode 371 is located on a first electrode of the LED, the first driving electrode 351, and the second insulating layer 307. The first electrode of the LED may include the third side surface of the LED.

The first connection electrode 371 is connected to the first electrode of the LED and the first driving electrode 351. The first connection electrode 371 is connected to the first alignment electrode 341 through a contact hole 50 defined through the second insulating layer 307 and the first insulating layer 306. In addition, the first connection electrode 371 is connected to the second drain electrode DE2 through a contact hole 60 defined through the second insulating layer 307, the first insulating layer 306, and the planarization layer 305. In other words, the first connection electrode 371 is connected to the first electrode of the LED, the first driving electrode 351, the first alignment electrode 341, and the second drain electrode DE2. Accordingly, the first electrode of the LED is connected to the second drain electrode DE2 of the second switching element Tr2.

In an embodiment, the first connection electrode 371 may include one or more metal materials selected from the group consisting of aluminum, titanium, indium, gold, and silver, or one or more transparent materials selected from the group consisting of indium tin oxide (ITO), ZnO:Al, and a CNT-conductive polymer composite. When the first connection electrode 371 includes two or more kinds of materials, the first connection electrode 371 according to an exemplary embodiment may have a structure in which the two or more kinds of materials are stacked.

The second connection electrode 372 is located on a second electrode of the LED, the second driving electrode 352, and the second insulating layer 307. The second electrode of the LED may include the fourth side surface of the LED.

The second connection electrode 372 is connected to the extension electrode 340 through a contact hole 70 defined through the second insulating layer 307, the first insulating layer 306, and the planarization layer 305. In other words, the second connection electrode 372 is connected to the second electrode of the LED, the second driving electrode 352, and the extension electrode 340. Accordingly, the second electrode of the LED is connected to the second driving power line VSL.

In an embodiment, the second connection electrode 372 may include a material substantially the same as a material included in the first connection electrode 371.

The light emitted from opposite side surfaces (i.e., the third side surface and the fourth side surface) of the LED may be incident to an inclined surface of the first driving electrode 351 and the second driving electrode 352. The light incident to this inclined surface is reflected in the Z-axis direction. For example, the light emitted from the third side surface of the LED toward the first driving electrode 351 may be reflected in the Z-axis direction by the inclined surface of the first driving electrode 351, and the light emitted from the fourth side surface of the LED toward the second driving electrode 352 may be reflected in the Z-axis direction by the inclined surface of the second driving electrode 352.

The first pixel PX1, the second pixel PX2, and the third pixel PX3 that are adjacent to each other in the X-axis direction may respectively include LEDs each emitting light of different colors. For example, the LED of the first pixel PX1 may be a red LED that emits red light, the LED of the second pixel PX2 may be a green LED that emits green light, and the LED of the third pixel PX3 may be a blue LED that emits blue light.

Figure 5:
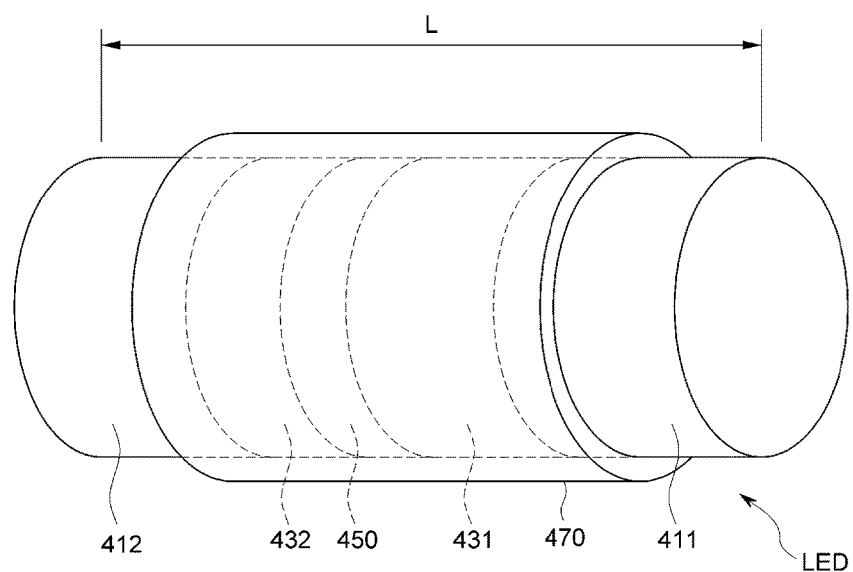
FIG. 5 is a view illustrating one of LEDs of FIG. 3.

FIG. 5 is a view illustrating one of LEDs of FIG. 3.

The LED is a light emitting element in the size of, for example, nanometers or micrometers. In an embodiment, the LED may have a cylindrical shape as illustrated in FIG. 5. However, although not illustrated, the LED may have a quadrangular parallelepiped shape or any of various other shapes.

The LED may include a first electrode 411, a second electrode 412, a first semiconductor layer 431, a second semiconductor layer 432, and an active layer 450. In an exemplary embodiment, the LED may further include an insulating layer 470 in addition to the components 411, 412, 431, 432, and 450 described above. In an embodiment, at least one of the first electrode 411 and the second electrode 412 may be omitted.

The first semiconductor layer 431 is located between the first electrode 411 and the active layer 450.

The active layer 450 is located between the first semiconductor layer 431 and the second semiconductor layer 432.

The second semiconductor layer 432 is located between the active layer 450 and the second electrode 412.

In an embodiment, the insulating layer 470 may have a ring shape surrounding part of the first electrode 411, part of the second electrode 412, the first semiconductor layer 431, the active layer 450, and the second semiconductor layer 432. As another example, the insulating layer 470 may have a ring shape surrounding only the active layer 450. The insulating layer 470 prevents or substantially prevents contact between the active layer 450 and the first driving electrode 351 and contact between the active layer 450 and the second driving electrode 352. In addition, the insulating layer 470 may substantially prevent degradation of the luminous efficiency of the LED by protecting the outer surface including the active layer 450.

In an embodiment, the first electrode 411, the first semiconductor layer 431, the active layer 450, the second semiconductor layer 432, and the second electrode 412 are sequentially stacked along the longitudinal direction of the LED. As used herein, the length of the LED means the size in the X-axis direction. For example, a length L of the LED may be in a range from about 2 µm to about 5 µm.

In an embodiment, the first and second electrodes 411 and 412 may be ohmic contact electrodes. However, the first and second electrodes 411 and 412 are not limited thereto, and may be Schottky contact electrodes.

The first and second electrodes 411 and 412 may include a conductive metal. For example, the first and second electrodes 411 and 412 may include one or more metallic materials of aluminum, titanium, indium, gold, and silver. In an embodiment, the first and second electrodes 411 and 412 may include indium tin oxide (ITO) or indium zinc oxide (IZO). In an embodiment, the first and second electrodes 411 and 412 may include substantially the same material. Alternatively, the first and second electrodes 411 and 412 may include different materials from each other.

The first semiconductor layer 431 may include, for example, an n-type semiconductor layer. As an example, when the LED is a blue LED, the n-type semiconductor layer may include a semiconductor material having the composition formula of $In_xAl_yGa_{1-x-y}N$, where $0 \le x \le 1$, $0 \le y \le 1$, and $0 \le x+y \le 1$, one or more of InAlGaN, GaN, AlGaN, InGaN, AlN, InN, or the like. The n-type semiconductor material may be doped with a first conductive dopant (e.g., Si, Ge, Sn, etc.).

The LED having a different color other than the aforementioned blue may include another kind of III-V semiconductor material as the n-type semiconductor layer.

In an embodiment, the first electrode 411 may be omitted. When the first electrode 411 is not present, the first semiconductor layer 431 may be connected to the first connection electrode 371.

The second semiconductor layer 432 may include, for example, a p-type semiconductor layer. As an example, when the LED is a blue LED, the p-type semiconductor layer may include a semiconductor material having the composition formula of $In_xAl_yGa_{1-x-y}N$, where $0 \le x \le 1$, $0 \le y \le 1$, and $0 \le x+y \le 1$, e.g., one or more of InAlGaN, GaN, AlGaN, InGaN, AlN, InN, or the like. The p-type semiconductor material may be doped with a second conductive dopant (e.g., Mg).

In an embodiment, the second electrode 412 may be omitted. When the second electrode 412 is not present, the second semiconductor layer 432 may be connected to the second connection electrode 372.

In an embodiment, the active layer 450 may have a single or multiple quantum well structure. For example, a cladding layer (not illustrated) doped with a conductive dopant may be disposed on at least one of the upper and lower sides of the active layer 450. The cladding layer (i.e., the cladding layer including the conductive dopant) may be an AlGaN layer or an InAlGaN layer. In addition to this, a material such as AlGaN and AlInGaN may be used as the active layer 450. When an electric field is applied to the active layer 450, light is generated by coupling of electron-hole pairs. The position of the active layer 450 may be variously changed depending on the type of the LED.

An active layer of an LED having a color other than the aforementioned blue may include another kind of III-V semiconductor material.

In an exemplary embodiment, although not illustrated, the LED may further include at least one of a phosphor layer, an active layer, a semiconductor layer, and an electrode above or below the first and second semiconductor layers 431 and 432.

Figure 7A:
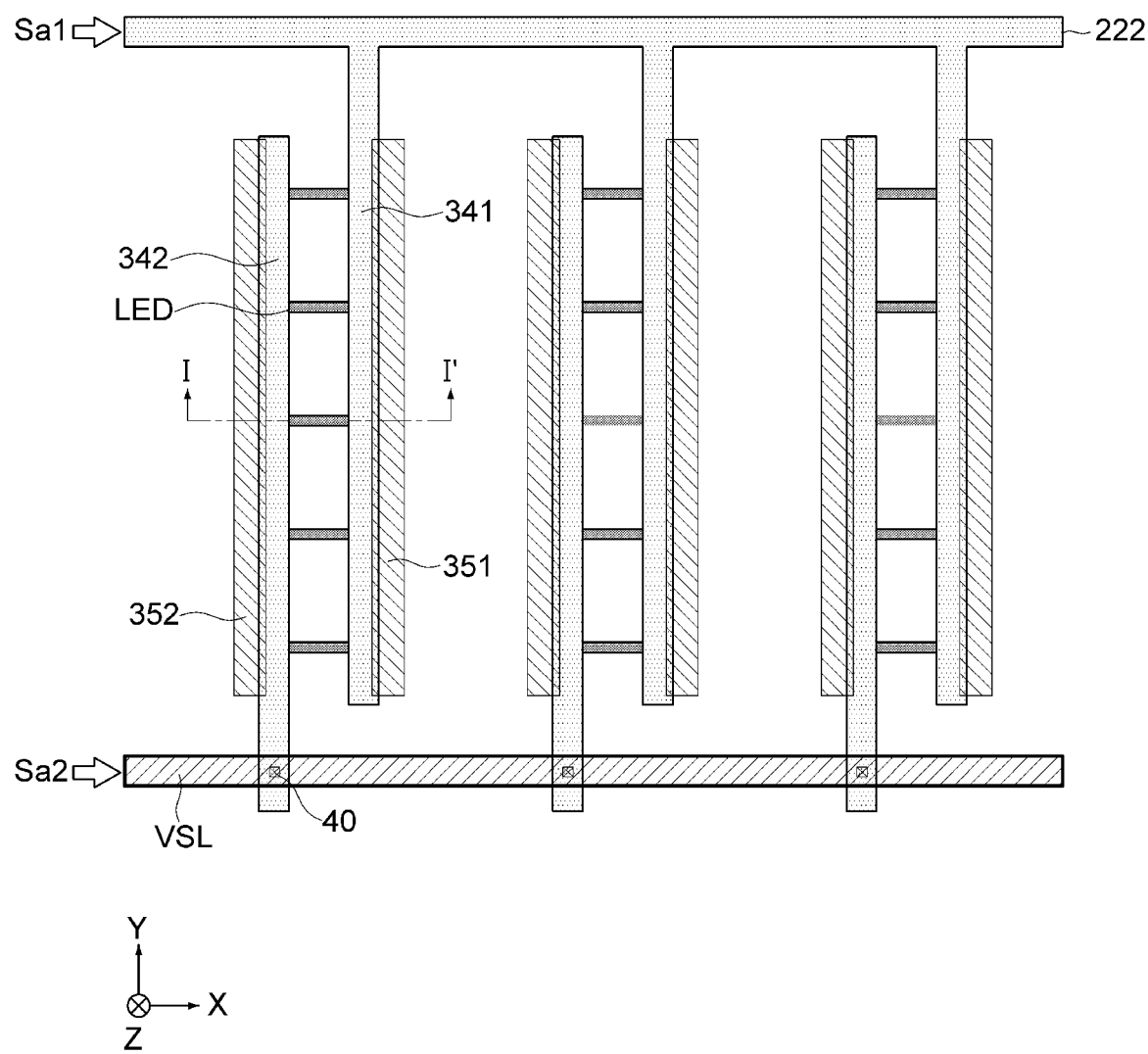
Figure 7B:
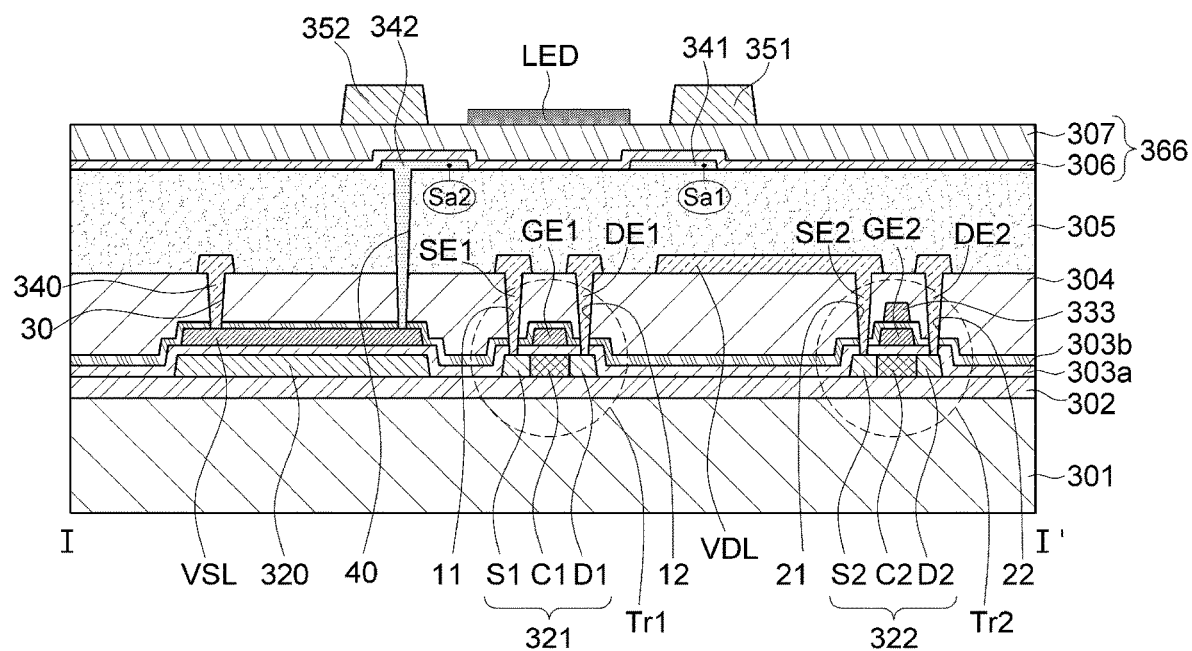
Figure 8A:
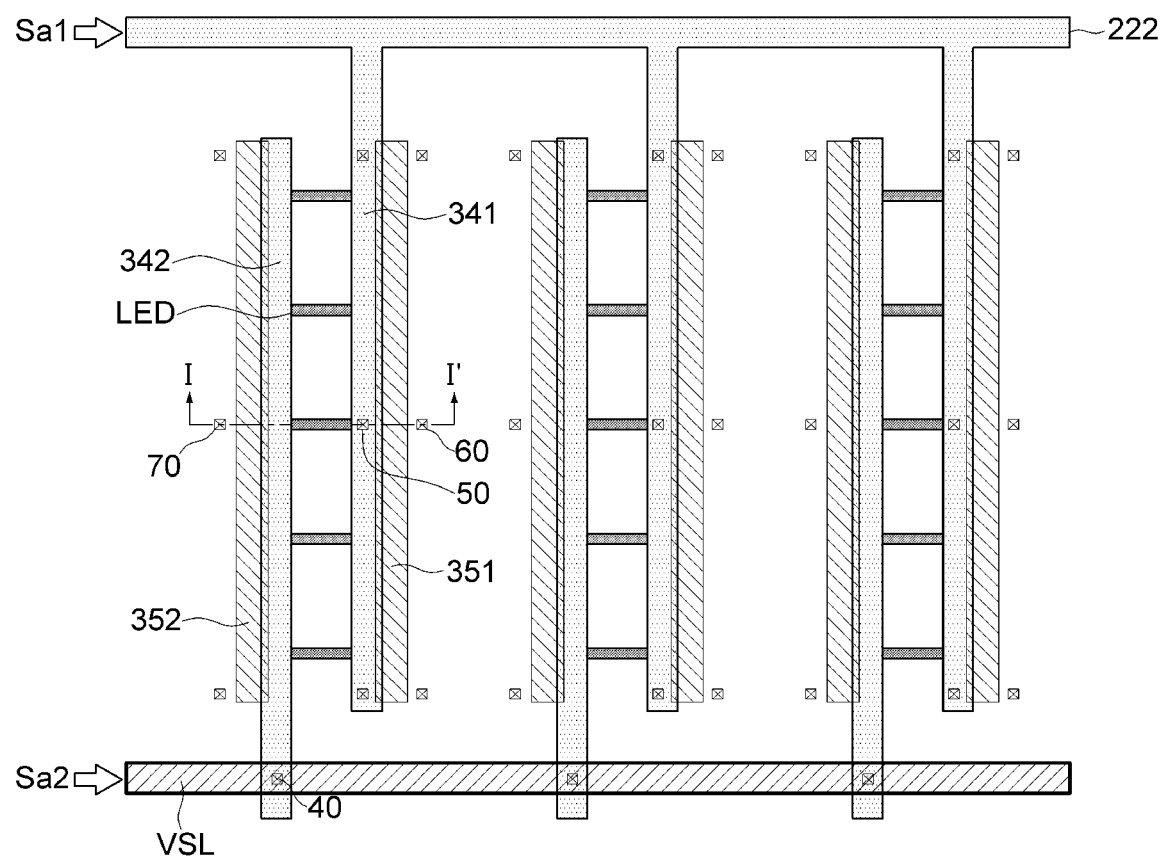
Figure 8B:
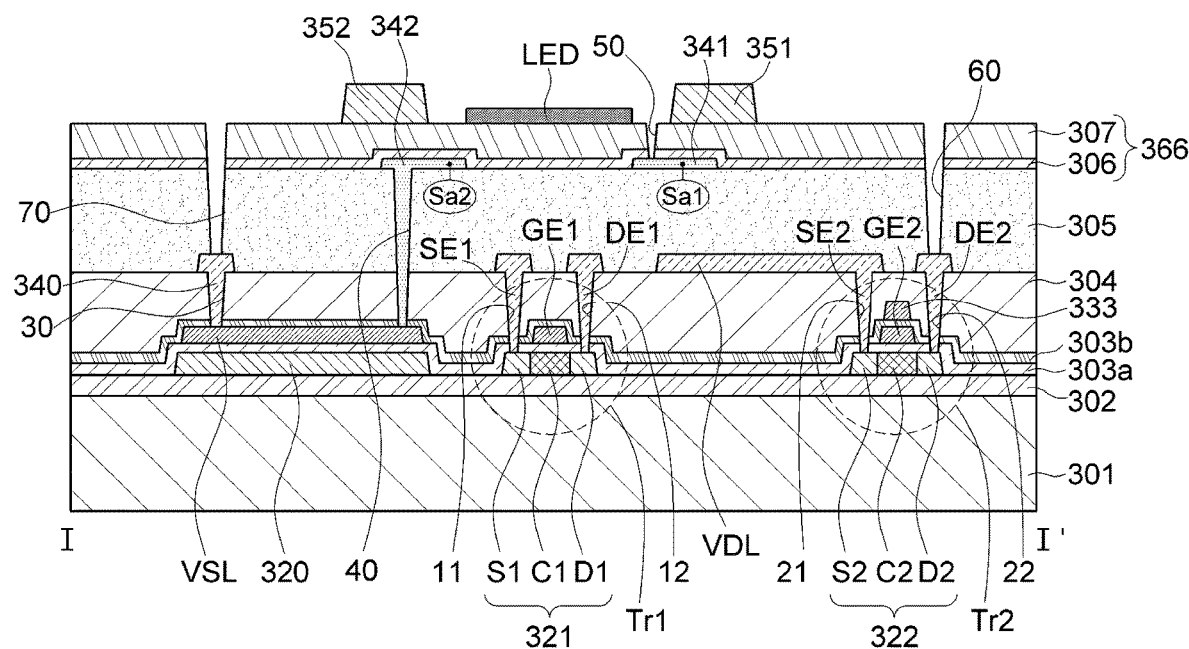
Figure 9A:
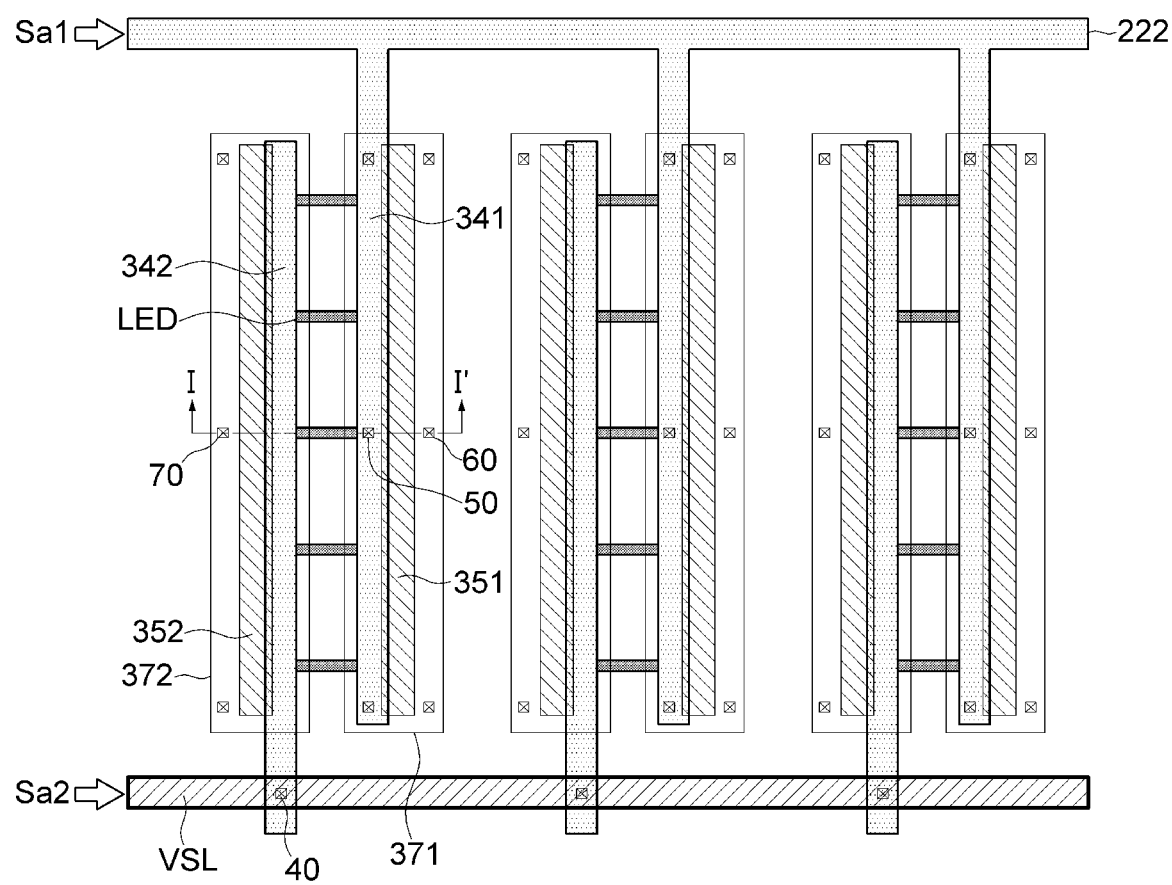
Figure 9B:
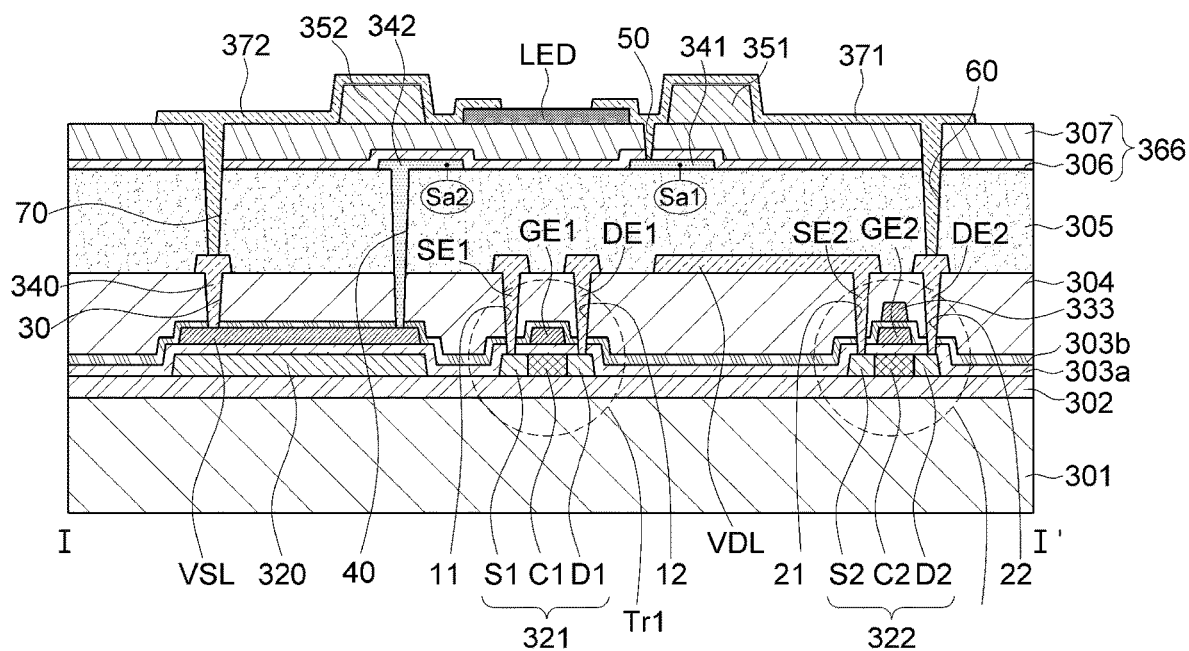

FIGS. 6A to 9B are diagrams for explaining a method of manufacturing a display device according to an embodiment of the present invention. FIG. 6B is a cross-sectional view taken along the line I-I' of FIG. 6A; FIG. 7B is a cross-sectional view taken along the line I-I' of FIG. 7A; FIG. 8B is a cross-sectional view taken along the line I-I' of FIG. 8A; and FIG. 9B is a cross-sectional view taken along the line I-I' of FIG. 9A.

Figure 6A:
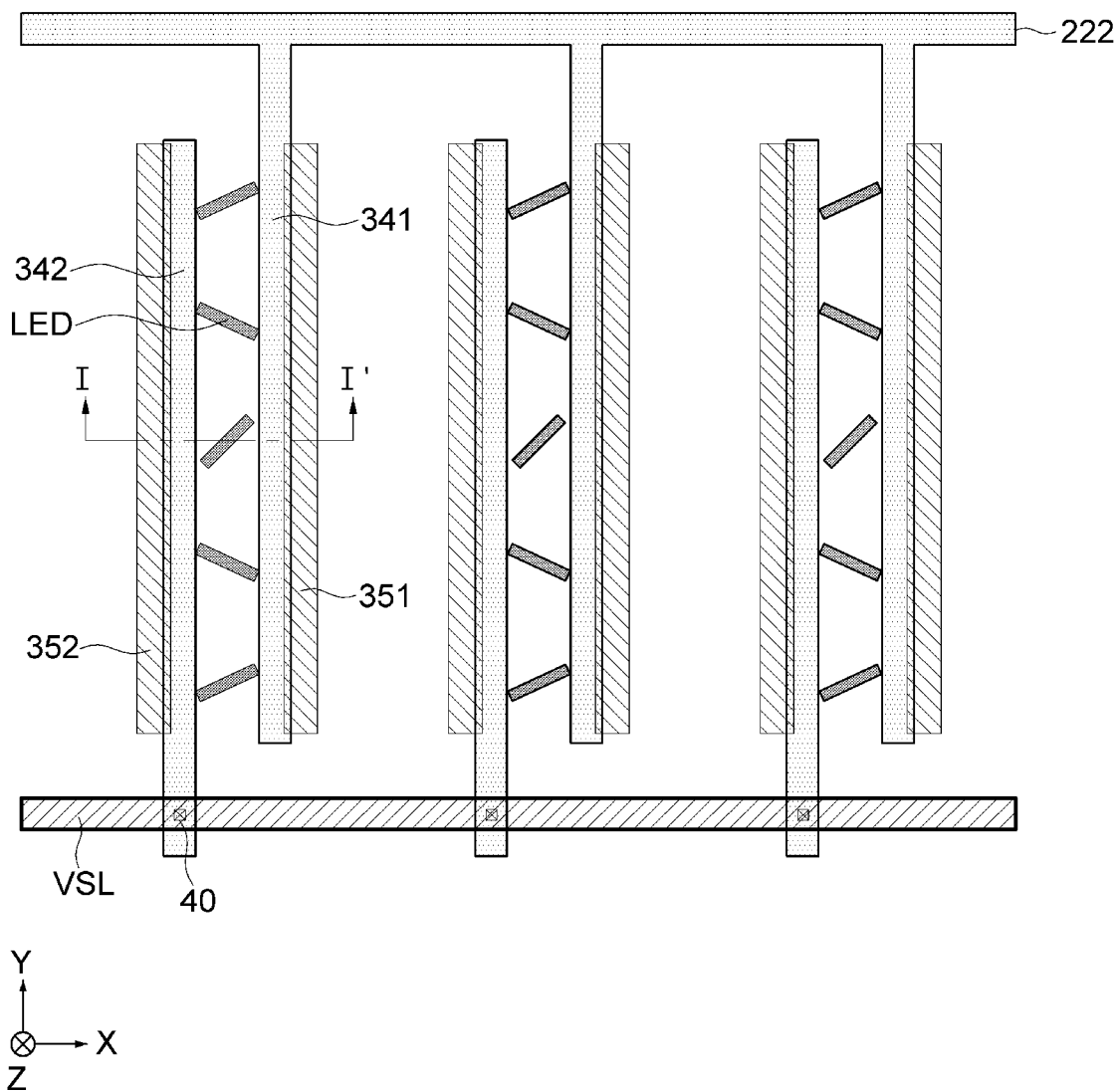
FIGS. 6A to 9B are diagrams for explaining a method of manufacturing a display device according to an embodiment of the present invention.
Figure 6B:
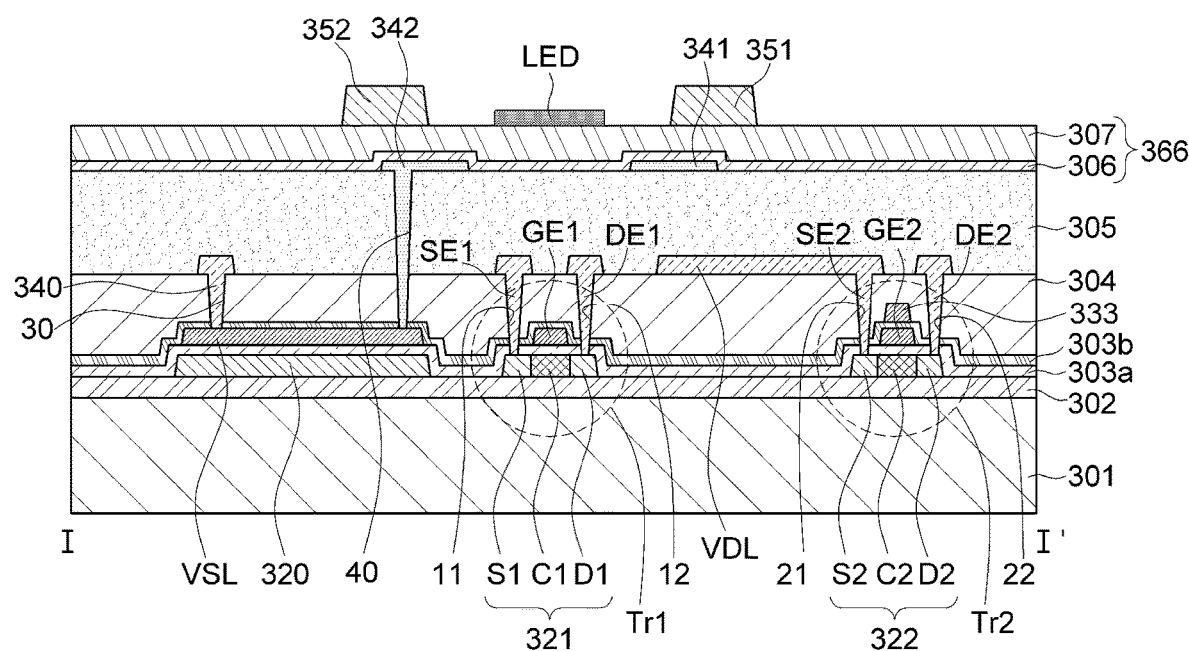

First, as illustrated in FIGS. 6A and 6B, the buffer layer 302 is formed on the substrate 301.

Thereafter, the dummy layer 320, the first semiconductor layer 321, and the second semiconductor layer 322 are formed on the buffer layer 302. The dummy layer 320, the first semiconductor layer 321, and the second semiconductor layer 322 may include substantially the same material. In an embodiment, the dummy layer 320, the first semiconductor layer 321, and the second semiconductor layer 322 may be formed by a photoresist process.

Next, the first gate insulating layer 303a is formed on the dummy layer 320, the first semiconductor layer 321, the second semiconductor layer 322, and the buffer layer 302.

Then, the second driving power line VSL, the first gate electrode GE1, and the second gate electrode GE2 are formed on the first gate insulating layer 303a. The second driving power line VSL overlaps the dummy layer 320, the first gate electrode GE1 overlaps the first channel area C1 of the first semiconductor layer 321, and the second gate electrode GE2 overlaps the second channel area C2 of the second semiconductor layer 322. The second driving power line VSL, the first gate electrode GE1, and the second gate electrode GE2 may include substantially the same material. In an embodiment, the second driving power line VSL, the first gate electrode GE1, and the second gate electrode GE2 may be formed by a photoresist process.

Next, impurity ions are implanted into the substrate 301 at which the second driving power line VSL, the first gate electrode GE1, and the second gate electrode GE2 are formed. In such a case, the impurity ions are implanted into respective source areas S1 and S2 and respective drain areas D1 and D2 of the first and second semiconductor layers 321 and 322 that do not overlap with the second driving power line VSL, the first gate electrode GE1 and the second gate electrode GE2 in a selective manner.

Next, the second gate insulating layer 303b is formed on the second driving power line VSL, the first gate electrode GE1, the second gate electrode GE2, and the first gate insulating layer 303a.

Then, the storage electrode 333 is formed on the second gate insulating layer 303a. The storage electrode 333 overlaps the second gate electrode GE2. In an embodiment, the storage electrode 333 may be formed by a photoresist process.

Thereafter, the insulating interlayer 304 is formed on the storage electrode 333.

Next, part of the insulating interlayer 304, the second gate insulating layer 303b, and the first gate insulating layer 303a are selectively removed, and, thus, the contact hole 30 exposing the second driving power line VSL, the first source contact hole 11 exposing the first source area S1, the first drain contact hole 12 exposing the first drain area D1, the second source contact hole 21 exposing the second source area S2, and the second drain contact hole 22 exposing the second drain area D2 are defined. In an embodiment, although not illustrated, when part of the insulating interlayer 304 is selective removed, the contact hole 30, the first source contact hole 11, the first drain contact hole 12, the second source contact hole 21, the second drain contact hole 22, and a storage contact hole may be defined by a photoresist process.

Next, the extension electrode 340, the first source electrode SE1, the first drain electrode DE1, the second source electrode SE2, the second drain electrode DE2, and the first driving power line VDL are formed on the insulating interlayer 304. In an embodiment, the extension electrode 340, the first source electrode SE1, the first drain electrode DE1, the second source electrode SE2, the second drain electrode DE2, and the first driving power line VDL may include substantially the same material. In such a case, the first driving power line VDL and the second source electrode SE2 may be unitarily formed.

The extension electrode 340 is connected to the second driving power line VSL through the contact hole 30, the first source electrode SE1 is connected to the first source area S1 through the first source contact hole 11, the first drain electrode DE1 is connected to the first drain area D1 through the first drain contact hole 12, the second source electrode SE2 is connected to the second source area S2 through the second source contact hole 21, the second drain electrode DE2 is connected to the second drain area D2 through the second drain contact hole 22, and the first driving power line VDL is connected to the storage electrode 333 through the storage contact hole.

Next, the planarization layer 305 is formed on the extension electrode 340, the first source electrode SE1, the first drain electrode DE1, the second source electrode SE2, the second drain electrode DE2, the first driving power line VDL, and the insulating interlayer 304.

Next, part of the planarization layer 305, the insulating interlayer 304, and the second gate insulating layer 303b is selectively removed, and, thus, the contact hole 40 exposing the second driving power line VSL is defined. In an embodiment, the contact hole 40 may be defined by a photoresist process.

Next, the first alignment electrode 341, the second alignment electrode 342, and the alignment line 222 are formed on the planarization layer 305. In an embodiment, the first alignment electrode 341, the second alignment electrode 342, and the alignment line 222 may include substantially the same material. In such a case, the first alignment electrode 341 and the alignment line 222 may be unitarily formed. In an embodiment, the first alignment electrode 341, the second alignment electrode 342, and the alignment line 222 may be formed by a photoresist process.

The second alignment electrode 342 is connected to the second driving power line VSL through the contact hole 40.

Next, the first insulating layer 306 is formed on the first alignment electrode 341, the second alignment electrode 342, and the alignment line 222.

Next, the second insulating layer 307 is formed on the first insulating layer 306.

Next, the first driving electrode 351 and the second driving electrode 352 are formed on the second insulating layer 307. The first driving electrode 351 and the second driving electrode 352 may include substantially the same material. The first driving electrode 351 overlaps the first alignment electrode 341, and the second driving electrode 352 overlaps the second alignment electrode 342. In an embodiment, the first driving electrode 351 and the second driving electrode 352 may be formed by a photoresist process.

Next, the LED is formed in the area (e.g., pixel area) between the first driving electrode 351 and the second driving electrode 352. For example, the LED may be selectively disposed in the pixel area by an inkjet printing method. In such a case, as illustrated in FIG. 6A, most of the LEDs are arranged in an unaligned state. In other words, when an axis parallel to the longitudinal direction of the LED is defined as the axis of the LED, the axis of the LED is not parallel to the X axis.

Next, as illustrated in FIGS. 7A and 7B, a first alignment signal Sa1 is applied to the alignment line 222, and a second alignment signal Sa2 is applied to the second driving power line VSL. The first alignment signal Sa1 applied to the alignment line 222 is applied to each first alignment electrode 341.

The second alignment signal Sa2 may be, for example, the second driving voltage VSS which is a DC voltage. In an embodiment, the first alignment signal Sa1 is an AC signal having a high voltage and a low voltage alternately, where the high voltage is higher than the second alignment signal Sa2 and the low voltage is lower than the second alignment signal Sa2. For example, the high voltage is higher than the second driving voltage VSS, and the low voltage is lower than the second driving voltage VSS.

An electric field is generated in the direction parallel to the X axis between the first alignment electrode 341 and the second alignment electrode 342 by the first alignment signal Sa1 applied to the first alignment electrode 341 and the second alignment signal Sa2 applied to the second alignment electrode 342, and the LEDs are aligned along one direction by the electric field. For example, the LEDs may be aligned such that their axes are parallel to the X axis, as illustrated in FIG. 7A.

Next, as illustrated in FIGS. 8A and 8B, part of the second insulating layer 307, the first insulating layer 306, and the planarization layer 305 is selectively removed, and thus the contact hole 60 exposing the second drain electrode DE2, the contact hole 50 exposing the first alignment electrode 341 and the contact hole 70 exposing the extension electrode 340 are defined. In an embodiment, these contact holes 60, 50, and 70 may be defined by a photoresist process. In such a case, the process of defining the contact holes 60, 50, and 70 may be performed in the state in which the first alignment signal Sa1 and the second alignment signal Sa2 are applied.

Next, as illustrated in FIGS. 9A and 9B, the first connection electrode 371 is formed on the first electrode of the LED, the first driving electrode 351, and the second insulating layer 307, and the second connection electrode 372 is formed on the second electrode of the LED, the second driving electrode 352, and the second insulating layer 307. The first connection electrode 371 and the second connection electrode 372 may include substantially the same material. In an embodiment, the first connection electrode 371 and the second connection electrode 372 may be formed by a photoresist process.

The first connection electrode 371 is connected to the second drain electrode DE2 and the first alignment electrode 341 through the contact holes 60 and 50, and the second connection electrode 372 is connected to the extension electrode 340 through the contact hole 70.

In an exemplary embodiment, the first connection electrode 371 and the second connection electrode 372 may be formed in the state in which the first alignment signal Sa1 and the second alignment signal Sa2 are applied.

Next, supply of the first alignment signal Sa1 to the alignment line 222 is blocked. For example, the electrical connection between the alignment line 222 and an alignment signal supplier for applying the first alignment signal Sa1 is broken.

Next, as illustrated in FIG. 3 described above, part of the alignment line 222 is removed to form the plurality of divided electrodes 200. Accordingly, the first alignment electrodes 341 of the pixels PX1, PX2, and PX3 are electrically separated from each other. In an embodiment, the alignment line 222 may be cut by a laser.

The first alignment electrode 341 is connected to the first driving electrode 351 and the second drain electrode DE2 by the first connection electrode 371, and the second alignment electrode 342 is connected to the second driving power line VSL. Accordingly, the voltage of the second drain electrode DE2 may be applied to the first alignment electrode 341, and the second driving voltage VSS may be applied to the second alignment electrode 342. Accordingly, the first alignment electrode 341 and the second alignment electrode 342 may be substantially prevented from falling into the floating state.

The first driving voltage VDD and the second driving voltage VSS may be applied from the aforementioned power supplier 123 of the display device.

In an exemplary embodiment, the first alignment signal Sa1 and the second alignment signal Sa2 may be blocked immediately after the alignment process of FIGS. 7A and 7B. That is, the first alignment signal Sa1 and the second alignment signal Sa2 may not be applied after the alignment process of FIGS. 7A and 7B.

Figure 10:
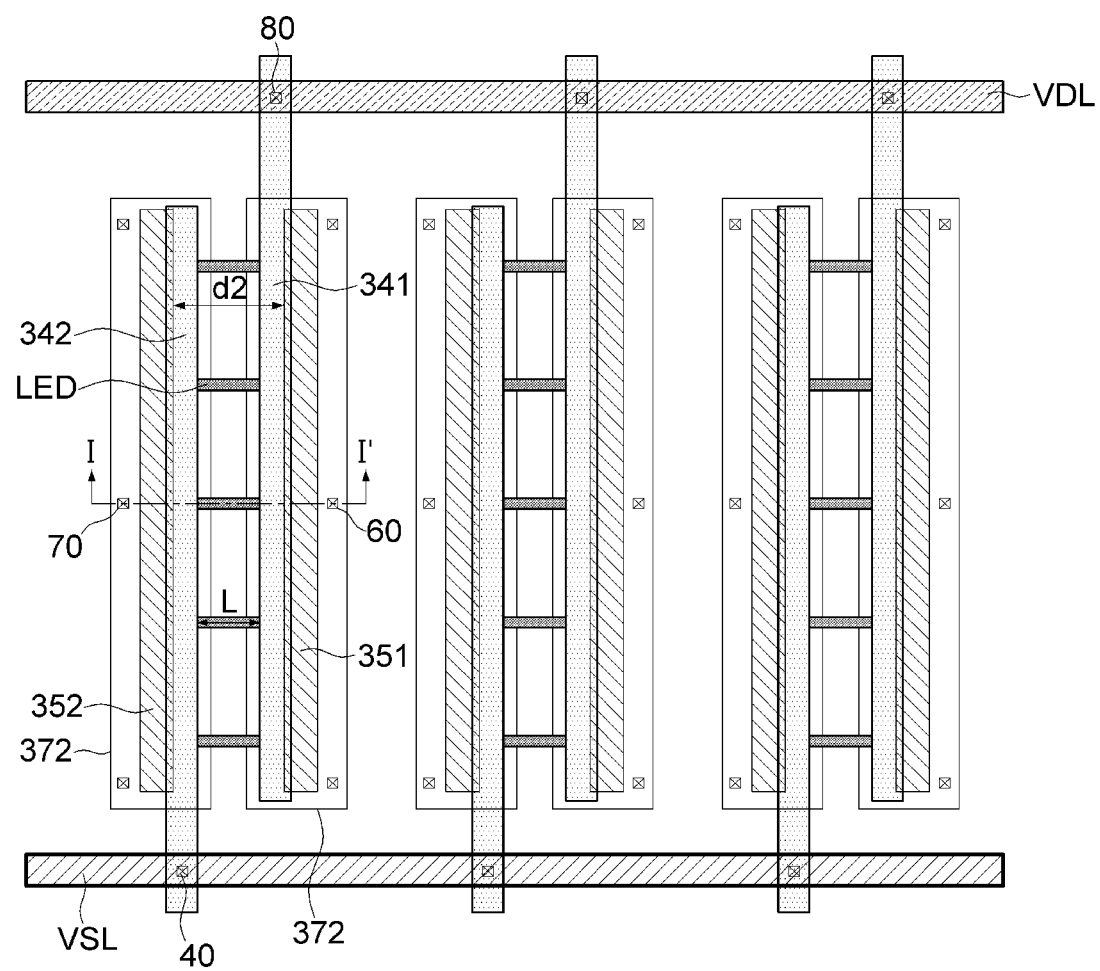
FIG. 10 is a plan view illustrating three adjacent pixels of a display device according to an embodiment of the present invention.
Figure 11:
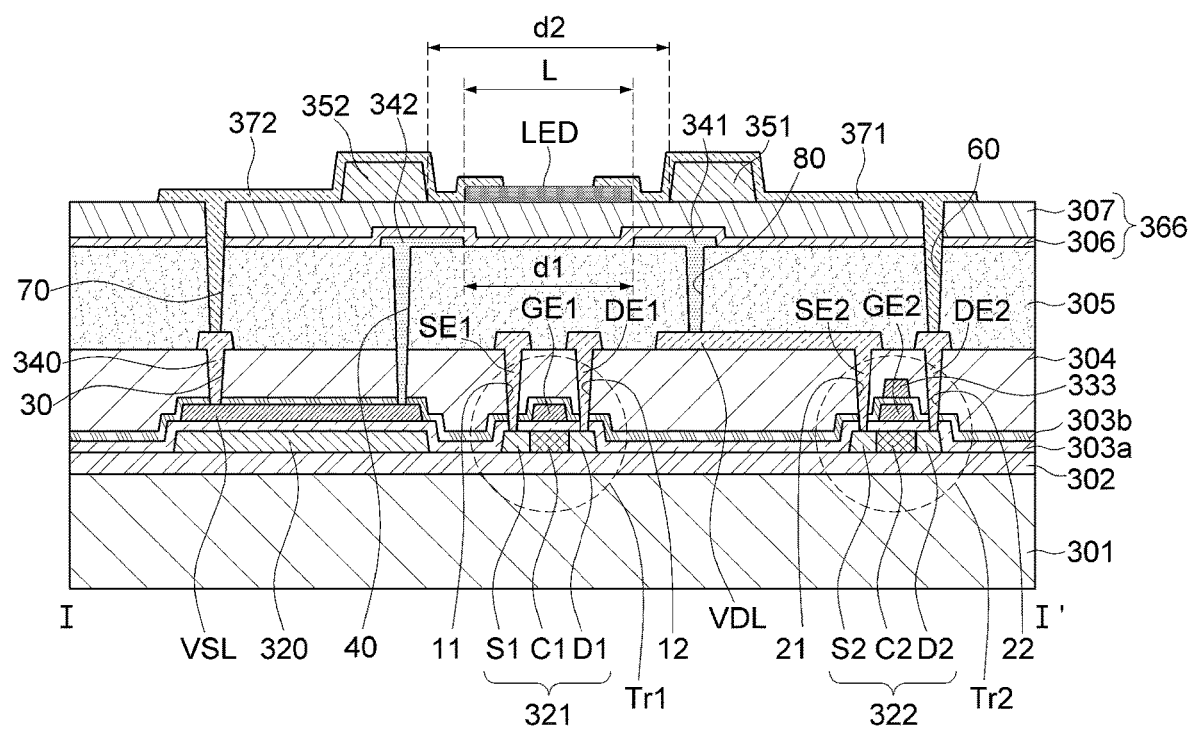
FIG. 11 is a cross-sectional view taken along the line I-I' of FIG. 10.

FIG. 10 is a plan view illustrating three adjacent pixels of a display device according to an embodiment of the present invention; and FIG. 11 is a cross-sectional view taken along the line I-I' of FIG. 10.

As illustrated in FIGS. 10 and 11, a display device according to an embodiment includes a substrate 301, a first switching element Tr1, a second switching element Tr2, a buffer layer 302, a dummy layer 320, a first gate insulating layer 303a, a second gate insulating layer 303b, an insulating interlayer 304, a planarization layer 305, an insulating layer 366, a first alignment electrode 341, a second alignment electrode 342, a first driving electrode 351, a second driving electrode 352, an LED, a first connection electrode 371, and a second connection electrode 372.

The substrate 301, the first switching element TR1, the second switching element Tr2, the buffer layer 302, the dummy layer 320, the first gate insulating layer 303a, the second gate insulating layer 303b, the insulating interlayer 304, the planarization layer 305, the insulating layer 366, the second alignment electrode 342, the first driving electrode 351, the second driving electrode 352, the LED, and the second connection electrode 372 of FIGS. 10 and 11 are substantially the same as the substrate 301, the first switching element Tr1, the second switching element Tr2, the buffer layer 302, the dummy layer 320, the first gate insulating layer 303a, the second gate insulating layer 303b, the insulating interlayer 304, the planarization layer 305, the insulating layer 366, the second alignment electrode 342, the first driving electrode 351, the second driving electrode 352, the LED, and the second connection electrode 372 of FIGS. 3 and 4, respectively.

The first alignment electrode 341 of FIGS. 10 and 11 is connected to the first driving power line VDL. For example, as illustrated in FIG. 11, the first alignment electrode 341 is connected to the first driving power line VDL through a contact hole 80 of the planarization layer 305. Accordingly, the first alignment electrode 341 receives the first driving voltage from the first driving power line VDL.

The first connection electrode 371 of FIGS. 10 and 11 is connected to the first electrode of the LED, the first driving electrode 351, and the second drain electrode DE2.

FIGS. 12A to 15B are diagrams for explaining a method of manufacturing a display device according to another embodiment of the present invention. FIG. 12B is a cross-sectional view taken along the line I-I' of FIG. 12A; FIG.

Figure 13A:
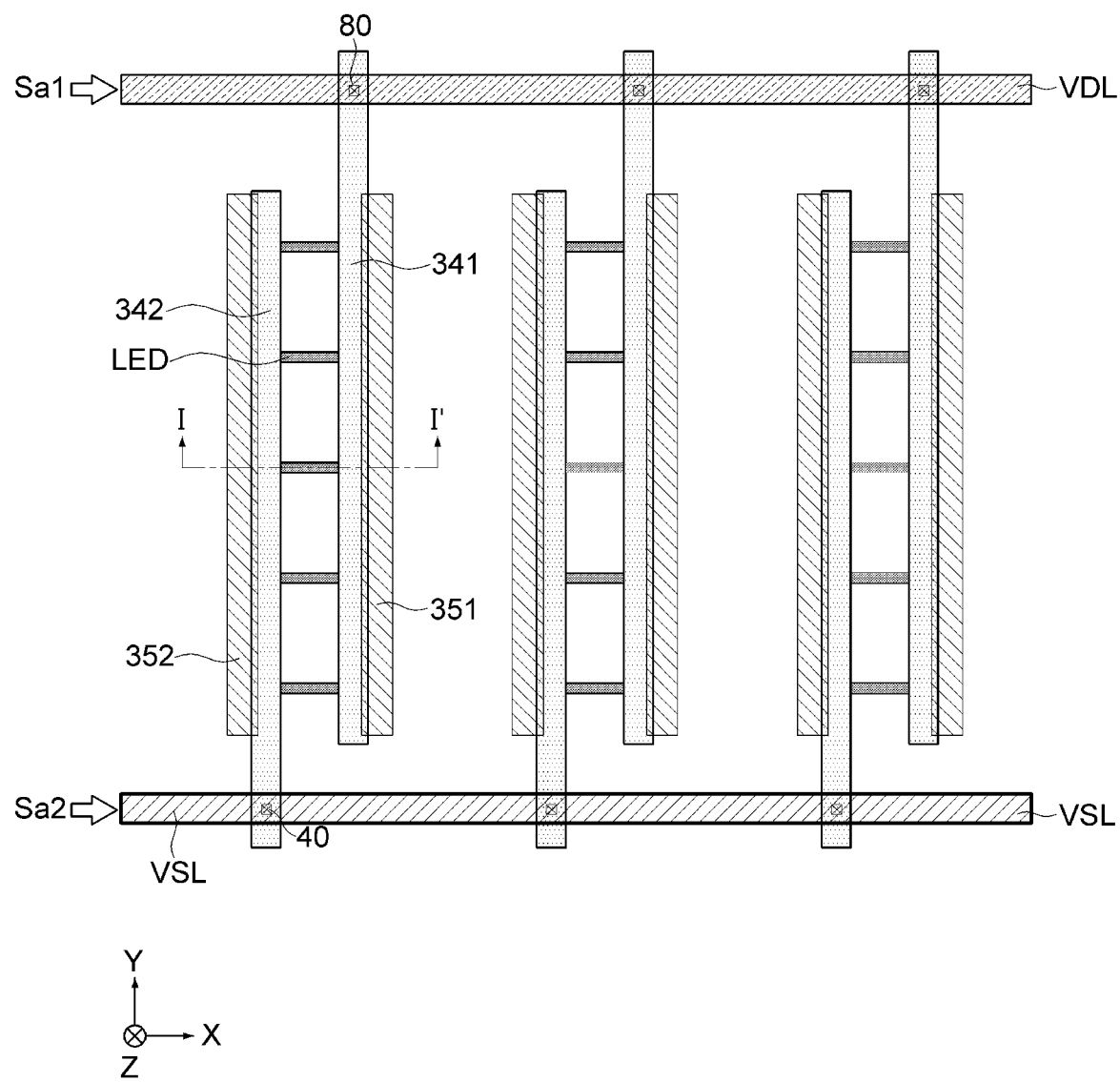

13B is a cross-sectional view taken along the line I-I' of FIG. 13A; FIG. 14B is a cross-sectional view taken along the line I-I' of FIG. 14A; and FIG. 15B is a cross-sectional view taken along the line I-I' of FIG. 15A.

Figure 12A:
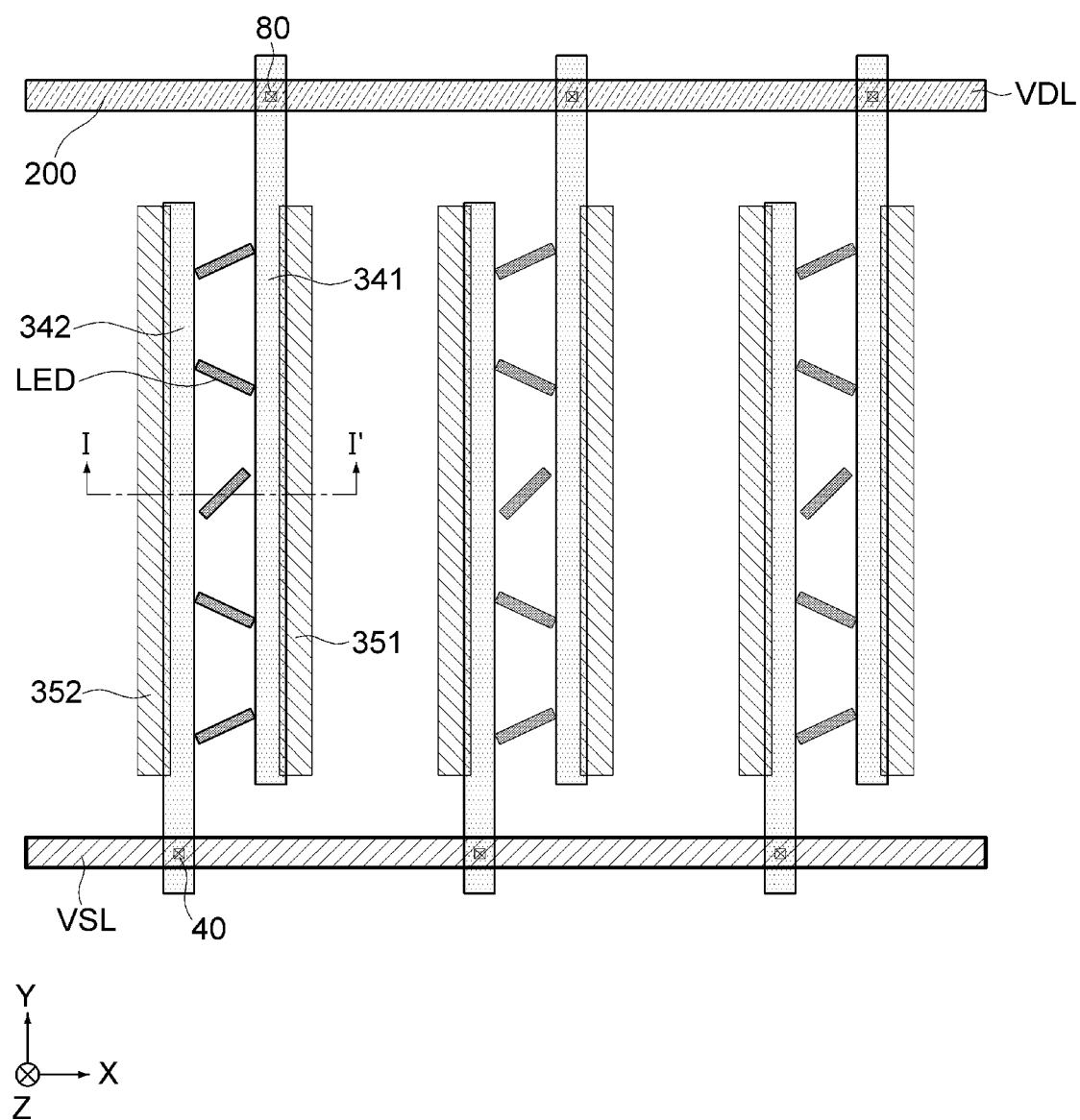
FIGS. 12A to 15B are diagrams for explaining a method of manufacturing a display device according to an embodiment of the present invention.
Figure 12B:
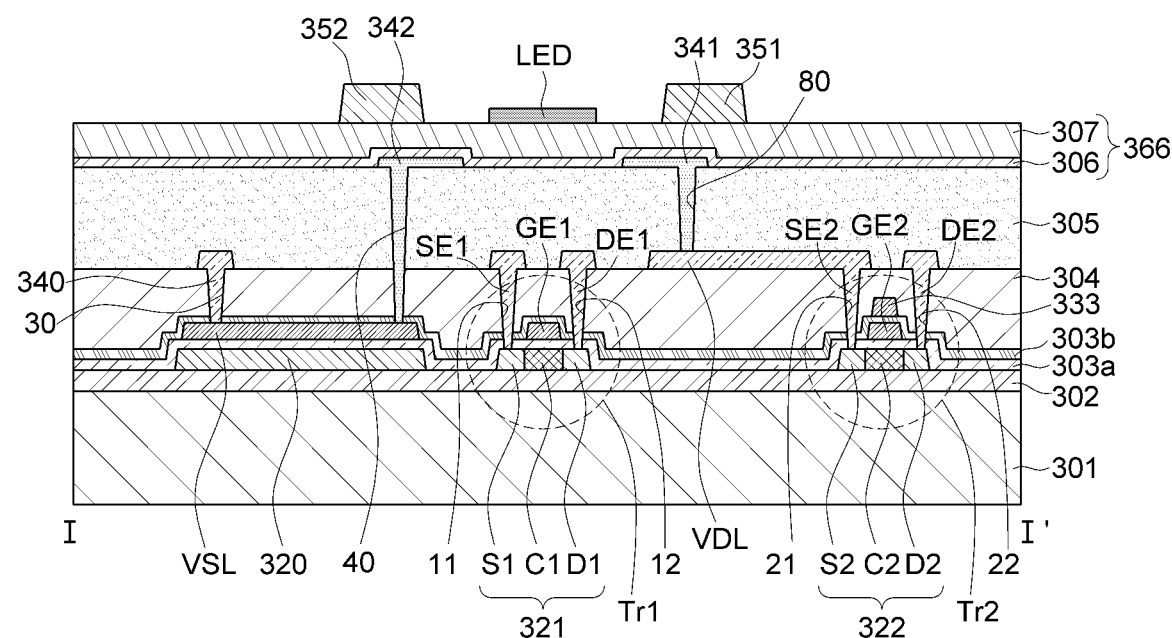

First, as illustrated in FIGS. 12A and 12B, the buffer layer 302, the dummy layer 320, the first semiconductor layer 321, the second semiconductor layer 322, the first gate insulating layer 303a, the second driving power line VSL, the first gate electrode GE1, the second gate electrode GE2, the second gate insulating layer 303b, the storage electrode 333, the insulating interlayer 304, the extension electrode 340, the first source electrode SE1, the first drain electrode DE1, the first driving power line VDL, the second source electrode SE2, the second drain electrode DE2, the planarization layer 305, the first insulating layer 306, the first alignment electrode 341, the second alignment electrode 342, the second insulating layer 307, the first driving electrode 351, the second driving electrode 352, and the LED are formed on the substrate 301. In an embodiment, the method of manufacturing the above-listed components is substantially the same as the method of manufacturing the components related to FIGS. 6A and 6B described above. However, the first alignment electrode 341 of FIGS. 12A and 12B is connected to the first driving power line VDL through the contact hole 80 of the planarization layer 305. In an embodiment, the contact hole 80 may be defined together with the contact hole 40 in the process of defining the contact hole 40 for connecting the second alignment electrode 342 and the second driving power line VSL.

Figure 13B:
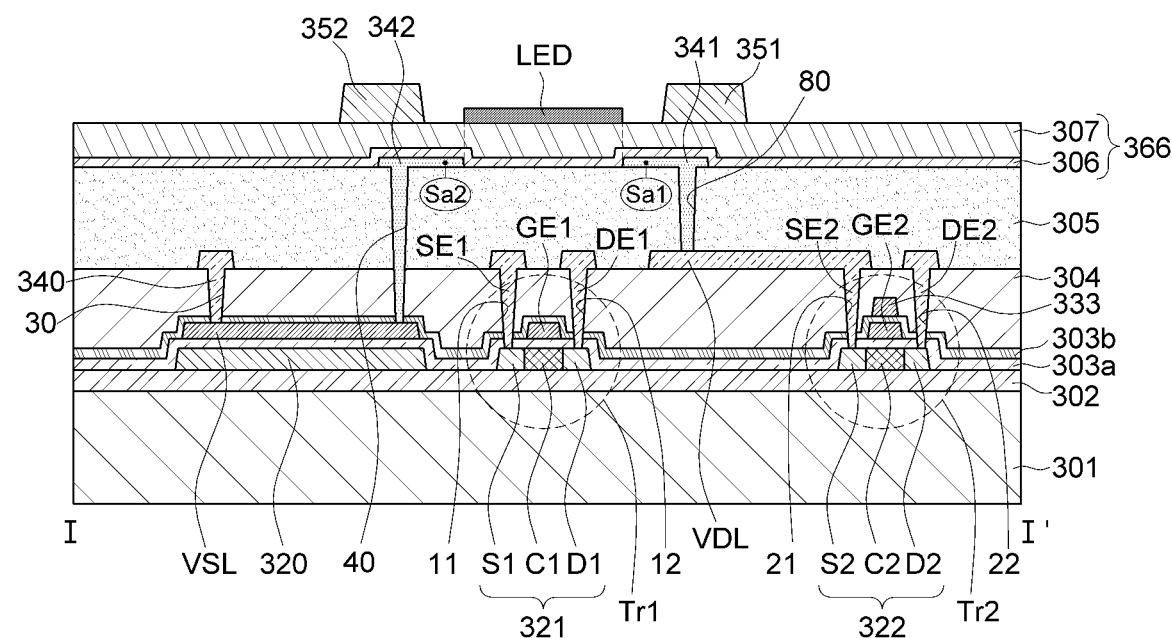

Next, as illustrated in FIGS. 13A and 13B, the first alignment signal Sa1 is applied to the first driving power line VDL, and the second alignment signal Sa2 is applied to the second driving power line VSL. The first alignment signal Sa1 applied to the first driving power line VDL is applied to each first alignment electrode 341.

The second alignment signal Sa2 may be, for example, the second driving voltage VSS which is a DC voltage. In an embodiment, the first alignment signal Sa1 is an AC signal having a high voltage and a low voltage alternately, where the high voltage is higher than the second alignment signal Sa2 and the low voltage is lower than the second alignment signal Sa2. For example, the high voltage is higher than the second driving voltage VSS, and the low voltage is lower than the second driving voltage VSS.

An electric field is generated in the direction parallel to the X axis between the first alignment electrode 341 and the second alignment electrode 342 by the first alignment signal Sa1 applied to the first alignment electrode 341 and the second alignment signal Sa2 applied to the second alignment electrode 342, and the LEDs are aligned along one direction by the electric field. For example, the LEDs may be aligned such that their axes are parallel to the X axis, as illustrated in FIG. 13A.

Figure 14A:
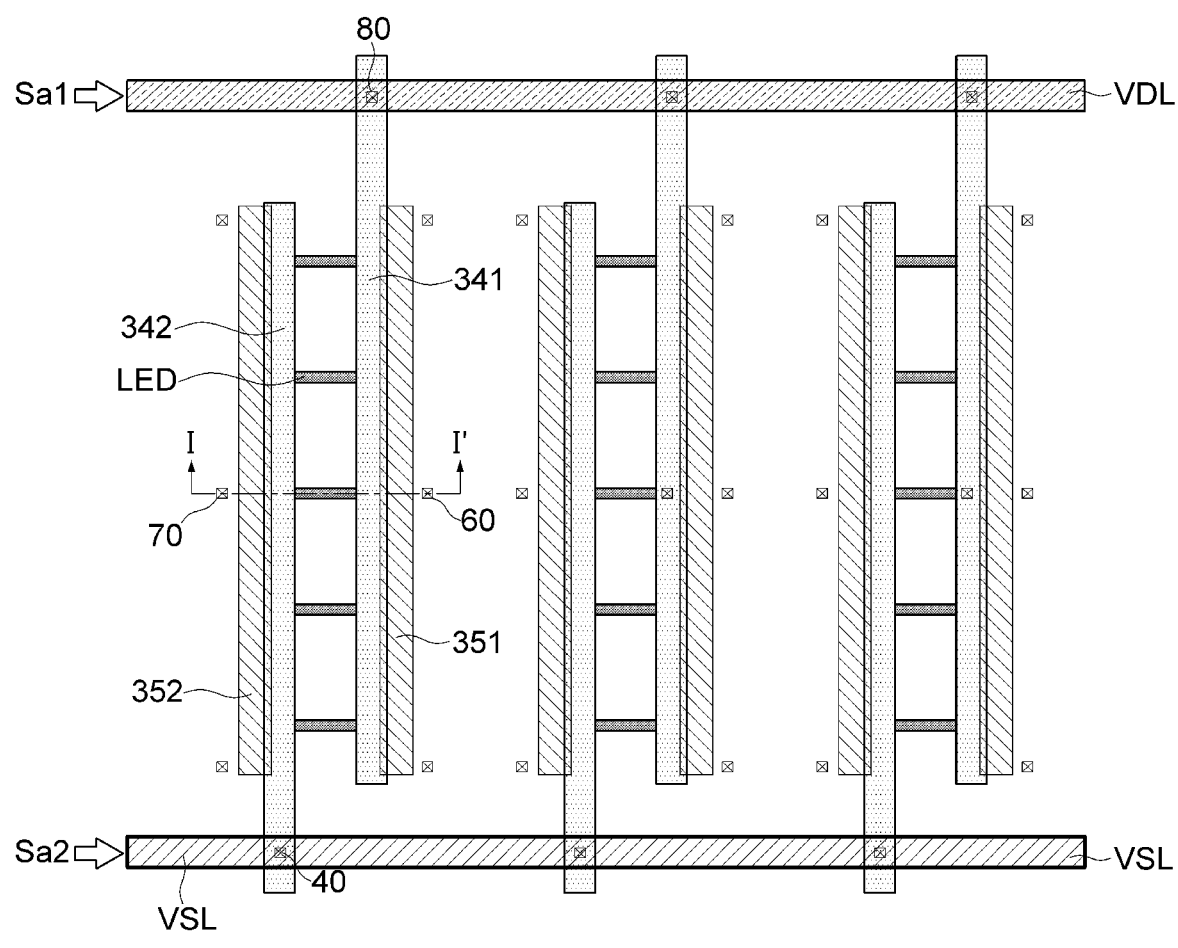
Figure 14B:
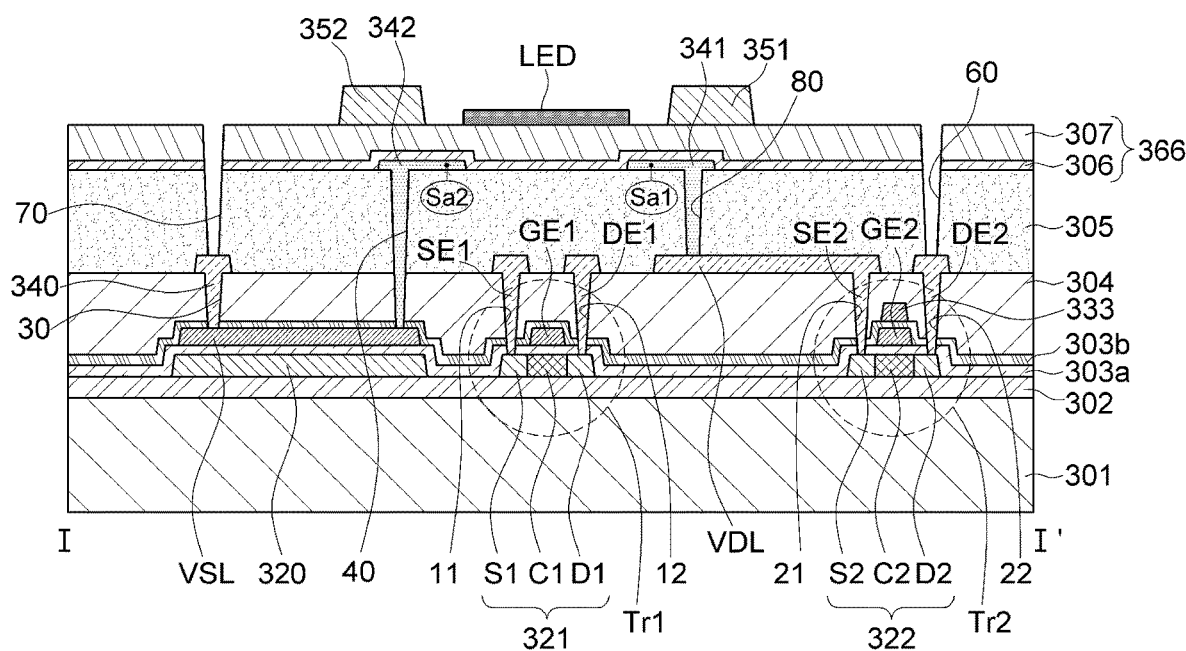

Next, as illustrated in FIGS. 14A and 14B, part of the second insulating layer 307, the first insulating layer 306, and the planarization layer 305 is selectively removed, and, thus, the contact hole 60 exposing the second drain electrode DE2 and the contact hole 70 exposing the extension electrode 340 are defined. In an embodiment, the contact holes 60 and 70 may be defined by a photoresist process. In an exemplary embodiment, the process of defining the contact holes 60 and 70 may be performed in the state in which the first alignment signal Sa1 and the second alignment signal Sa2 are applied.

Figure 15A:
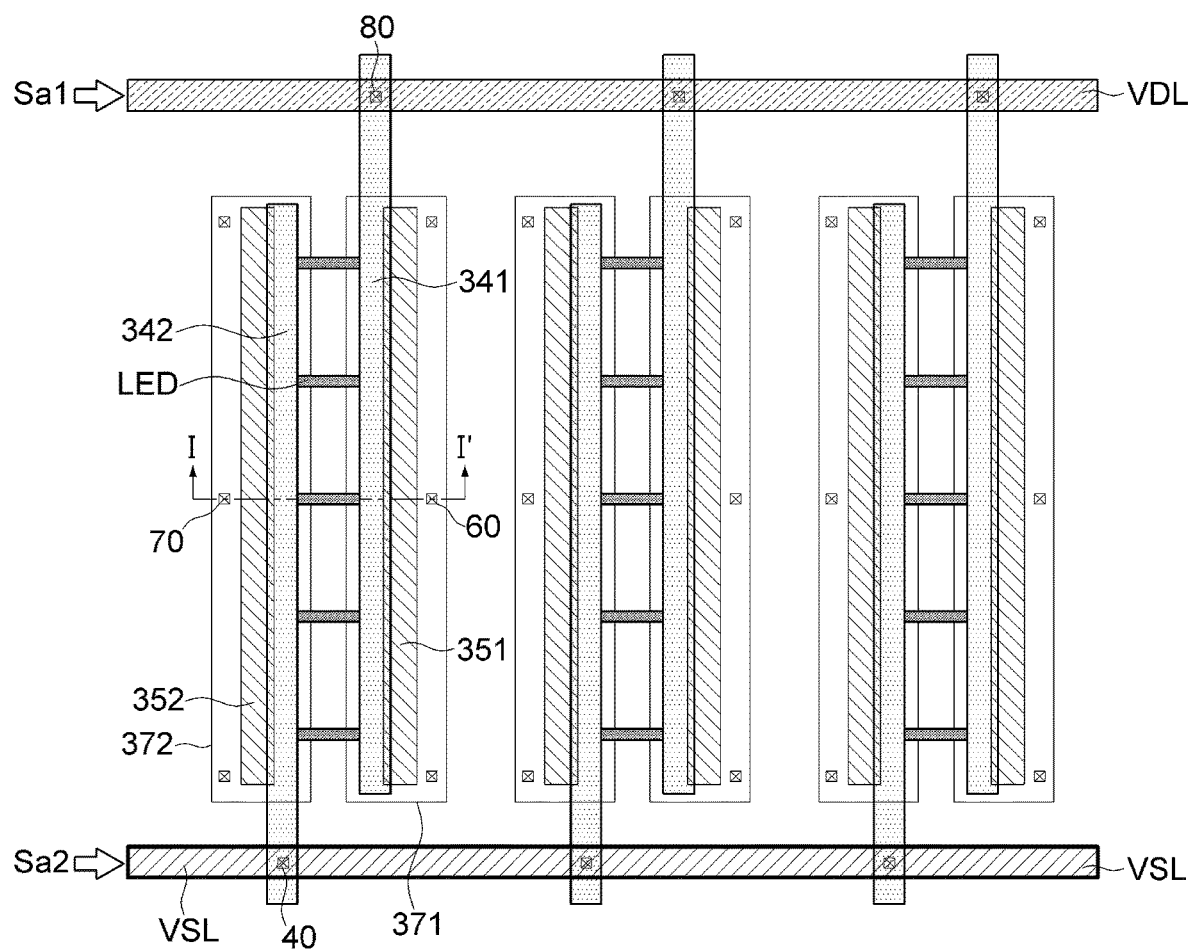
Figure 15B:
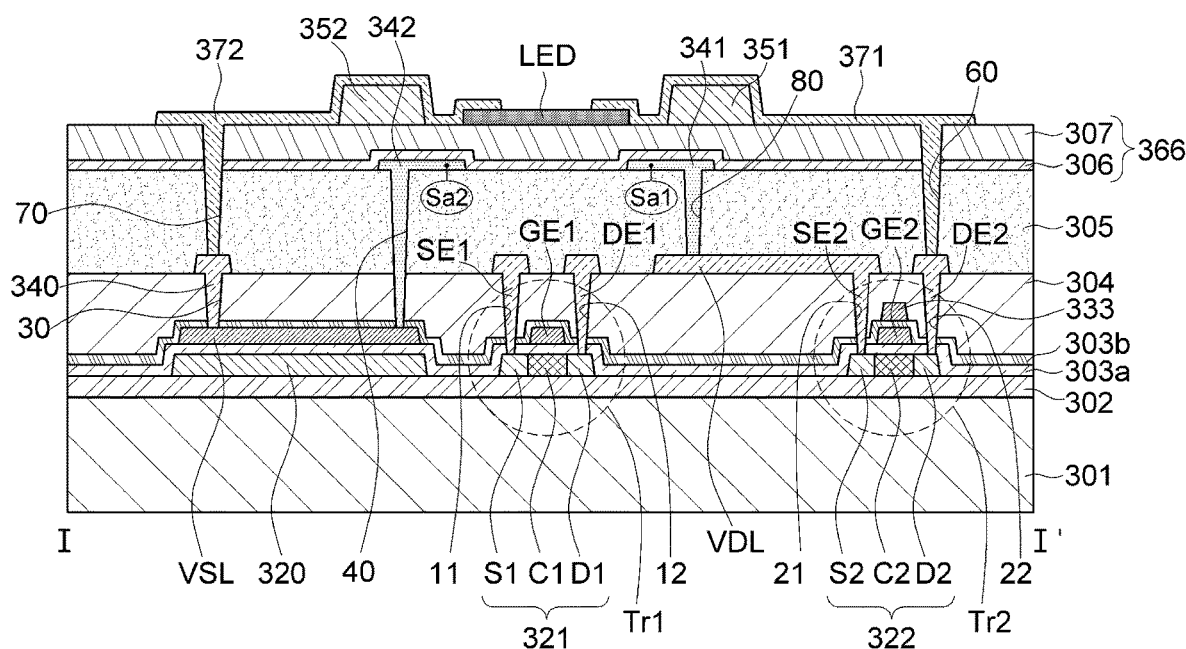

Next, as illustrated in FIGS. 15A and 15B, the first connection electrode 371 is formed on the first electrode of the LED, the first driving electrode 351, and the second insulating layer 307, and the second connection electrode 372 is formed on the second electrode of the LED, the second driving electrode 352, and the second insulating layer 307. The first connection electrode 371 and the second connection electrode 372 may include substantially the same material. In an embodiment, the first connection electrode 371 and the second connection electrode 372 may be formed by a photoresist process.

The first connection electrode 371 is connected to the second drain electrode DE2 through the contact hole 60, and the second connection electrode 372 is connected to the extension electrode 340 through the contact hole 70.

In an exemplary embodiment, the first connection electrode 371 and the second connection electrode 372 may be formed in the state in which the first alignment signal Sa1 and the second alignment signal Sa2 are applied.

Next, supply of the first alignment signal Sa1 to the first driving power line VDL is blocked. For example, the electrical connection between the first driving power line VDL and a signal supplier for applying the first alignment signal Sa1 is broken.

Next, the first driving voltage VDD is applied to the first driving power line VDL. Accordingly, the first driving voltage VDD is also applied to the first alignment electrode 341 connected to the first driving power line VDL.

The first alignment electrode 341 is connected to the first driving power line VDL, and the second alignment electrode 342 is connected to the second driving power line VSL. Accordingly, the first driving voltage VDD may be applied to the first alignment electrode 341, and the second driving voltage VSS may be applied to the second alignment electrode 342. Accordingly, the first alignment electrode 341 and the second alignment electrode 342 may be substantially prevented from falling into the floating state.

Figure 16:
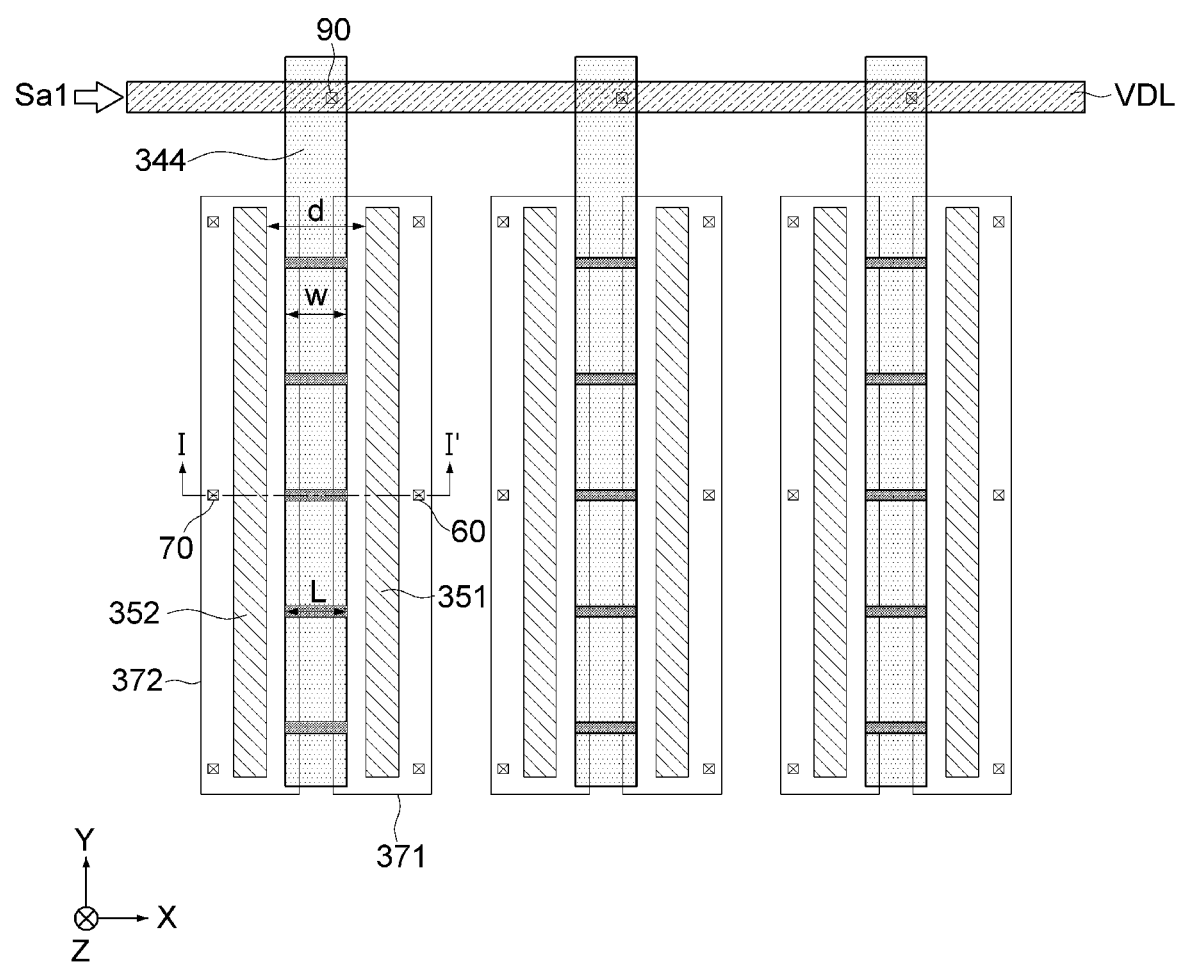
FIG. 16 is a plan view illustrating three adjacent pixels of a display device according to an embodiment of the present invention.
Figure 17:
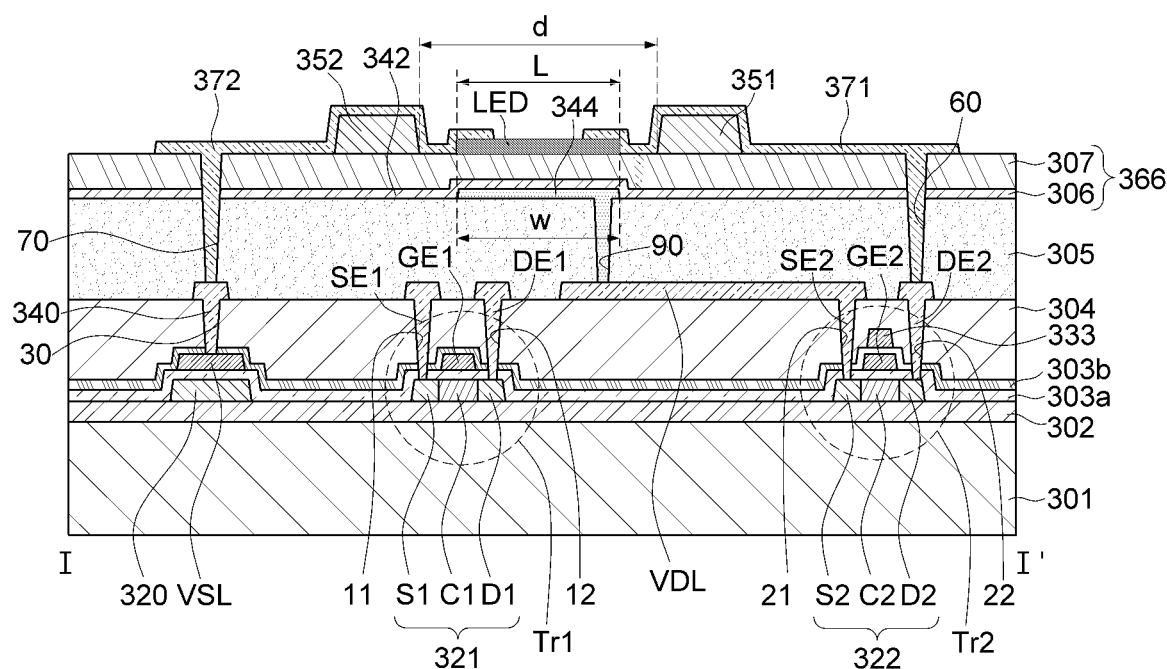
FIG. 17 is a cross-sectional view taken along the line I-I' of FIG. 16.

FIG. 16 is a plan view illustrating three adjacent pixels of a display device according to an embodiment of the present invention; and FIG. 17 is a cross-sectional view taken along the line I-I' of FIG. 16.

As illustrated in FIGS. 16 and 17, a display device according to an embodiment includes a substrate 301, a first switching element Tr1, a second switching element Tr2, a buffer layer 302, a dummy layer 320, a first gate insulating layer 303a, a second gate insulating layer 303b, an insulating interlayer 304, a planarization layer 305, an insulating layer 366, an alignment electrode 344, a first driving electrode 351, a second driving electrode 352, an LED, a first connection electrode 371, and a second connection electrode 372.

The substrate 301, the first switching element Tr1, the second switching element Tr2, the buffer layer 302, the dummy layer 320, the first gate insulating layer 303a, the second gate insulating layer 303b, the insulating interlayer 304, the planarization layer 305, the insulating layer 366, the first driving electrode 351, the second driving electrode 352, the LED, and the second connection electrode 372 of FIGS. 16 and 17 are substantially the same as the substrate 301, the first switching element Tr1, the second switching element Tr2, the buffer layer 302, the dummy layer 320, the first gate insulating layer 303a, the second gate insulating layer 303b, the insulating interlayer 304, the planarization layer 305, the insulating layer 366, the first driving electrode 351, the second driving electrode 352, the LED, and the second connection electrode 372 of FIGS. 3 and 4, respectively.

The first connection electrode 371 of FIGS. 16 and 17 is connected to the first electrode of the LED, the first driving electrode 351, and the second drain electrode DE2.

As illustrated in FIG. 16, the alignment electrode 344 is located between the first driving electrode 351 and the second driving electrode 352.

In an embodiment, a width w of the alignment electrode 344 is less than a distance d between the first driving electrode 351 and the second driving electrode 352. As used herein, the width of the alignment electrode 344 means the size of the alignment electrode 344 in the X-axis direction.

As illustrated in FIG. 16, the LED is located on the alignment electrode 344. The LED overlaps the alignment electrode 344. For example, the entire area of the LED may overlap the alignment electrode 344. In an embodiment, a length of the LED may be the same (same or substantially the same) as the width w of the alignment electrode 344. As used herein, the length of the LED means the size of the LED in the X-axis direction.

The alignment electrode 344 is connected to the first driving power line VDL. For example, as illustrated in FIG. 17, the alignment electrode 344 is connected to the first driving power line VDL through a contact hole 90 of the planarization layer 305. Accordingly, the first alignment electrode 341 receives the first driving voltage VDD from the first driving power line VDL.

In an embodiment, the alignment electrode 344 may include a material substantially the same as a material included in the first alignment electrode 341 described above.

The first connection electrode 371 of FIGS. 16 and 17 is connected to the first electrode of the LED, the first driving electrode 351, and the second drain electrode DE2.

Figure 19A:
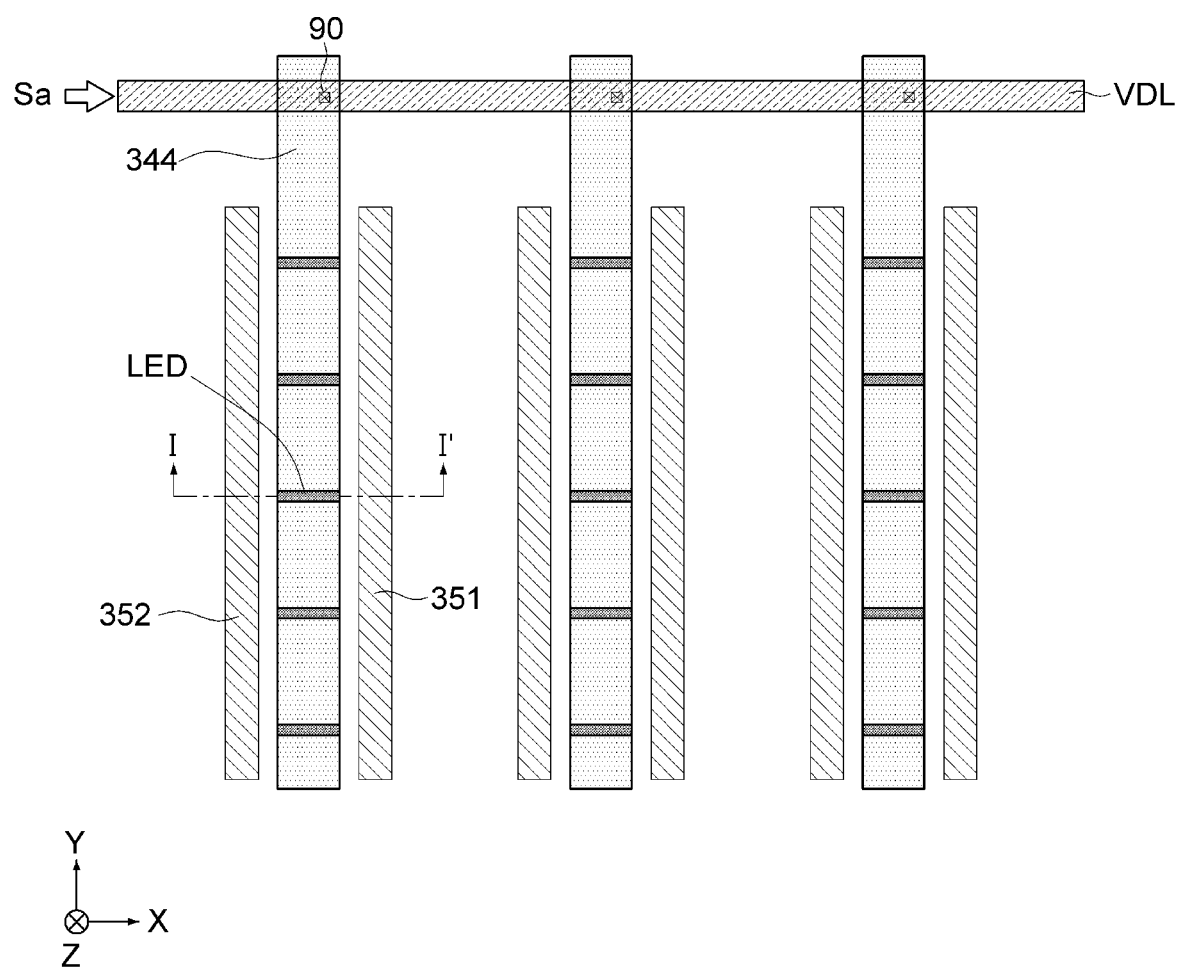
Figure 19B:
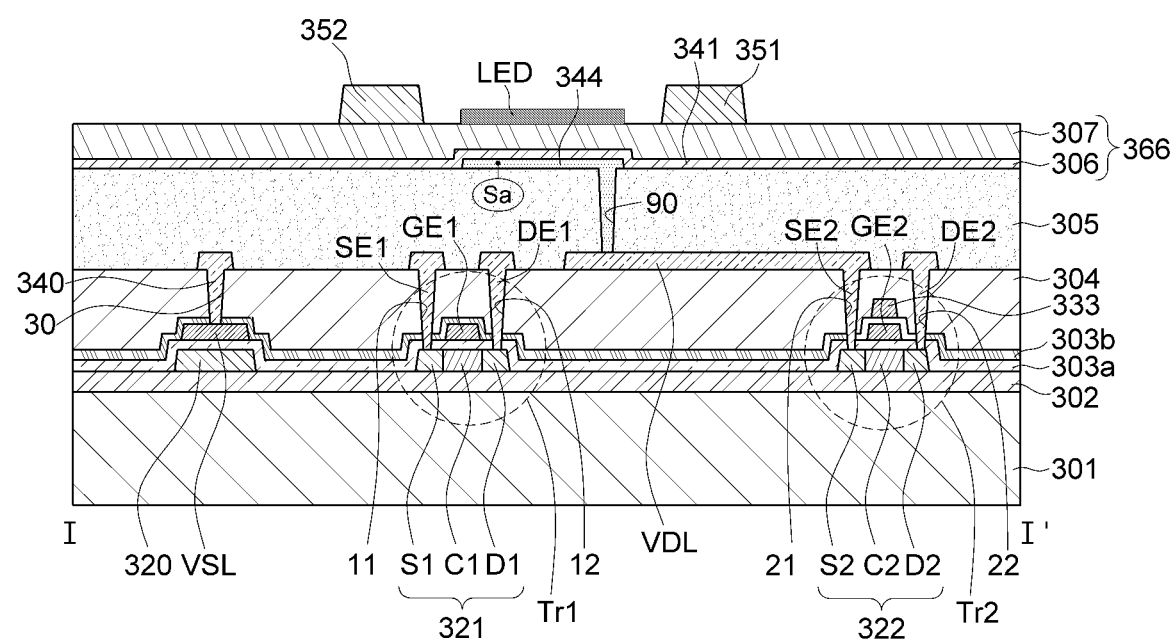
Figure 20A:
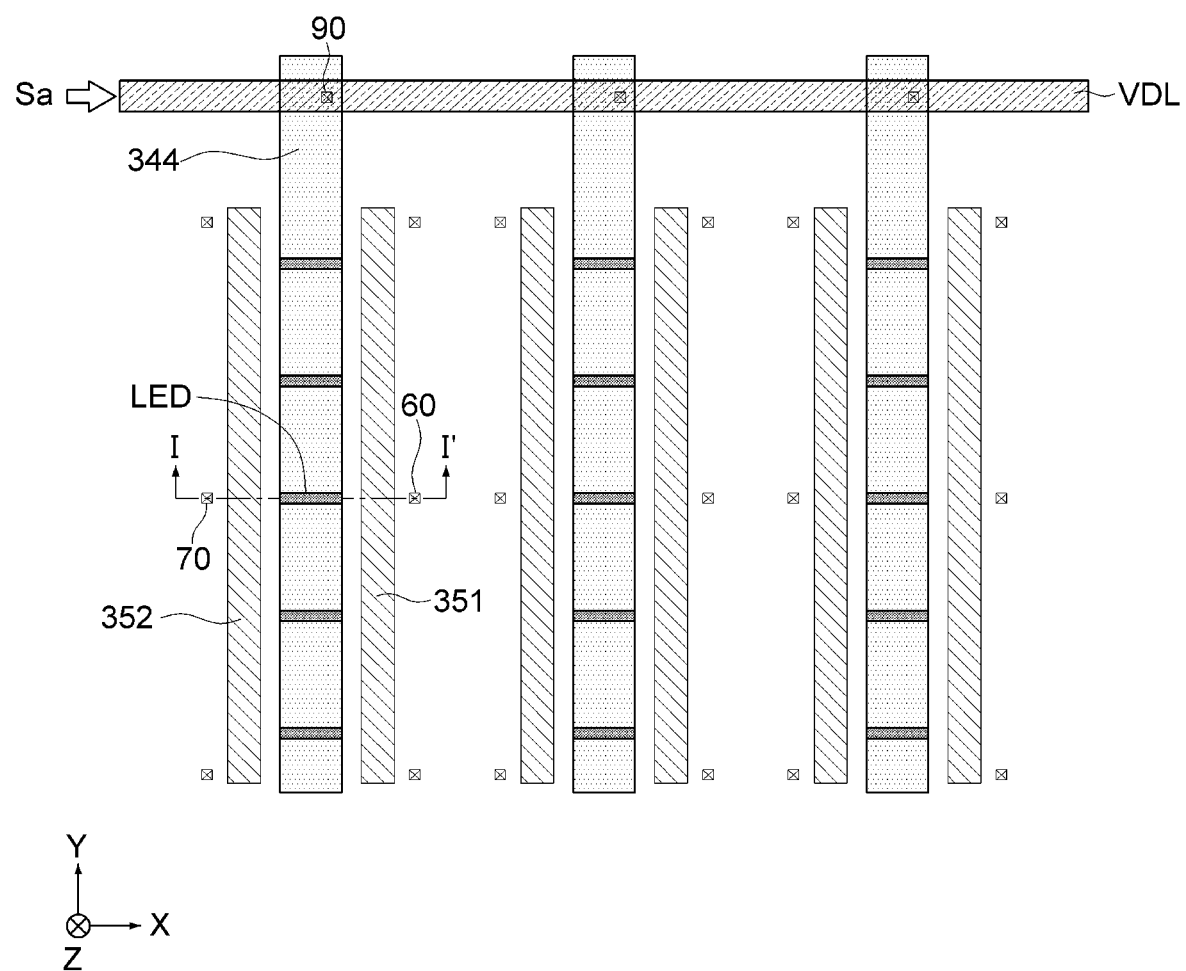
Figure 20B:
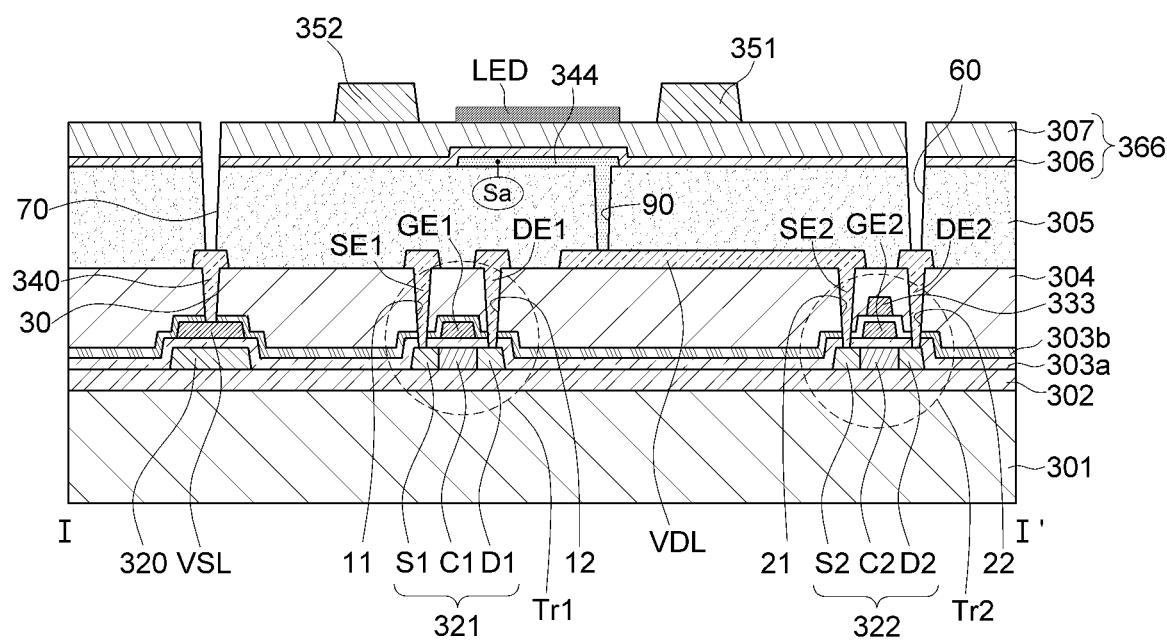
Figure 21A:
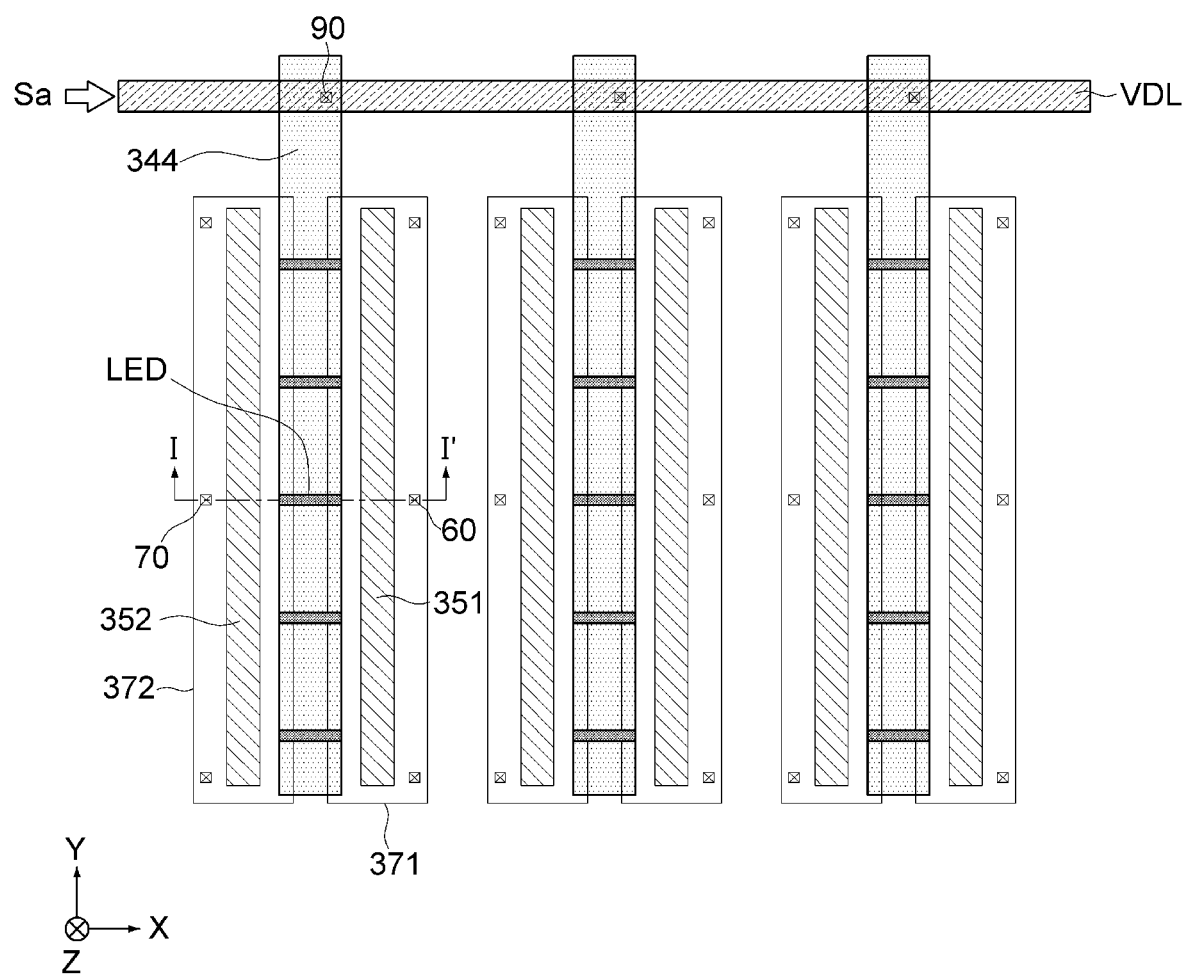
Figure 21B:
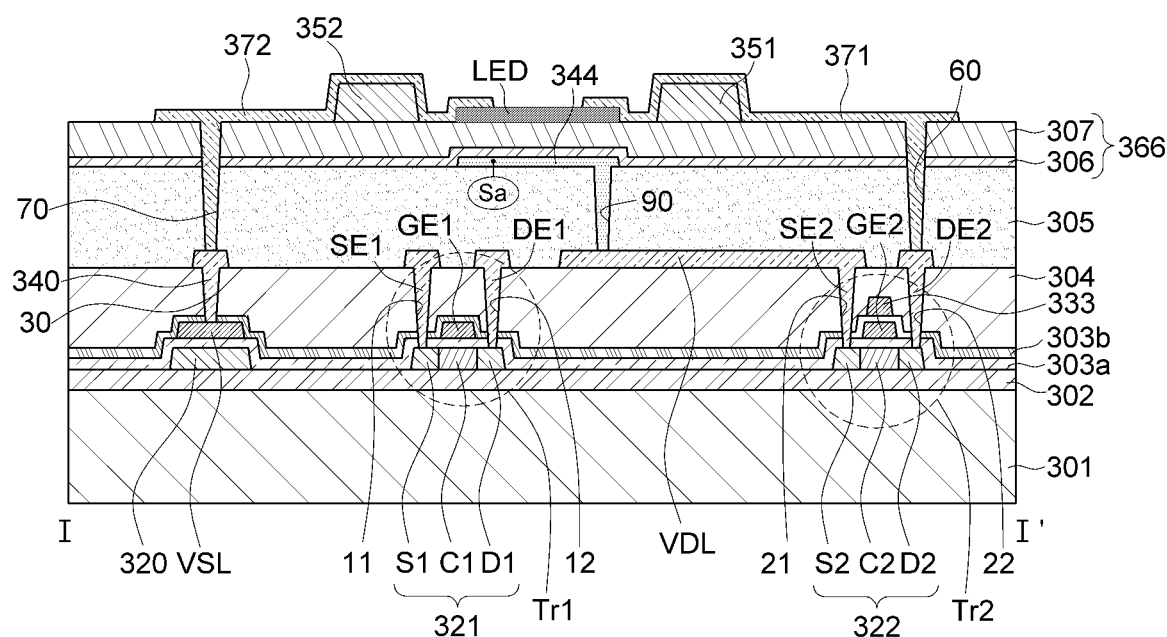

FIGS. 18A to 21B are diagrams for explaining a method of manufacturing a display device according to another embodiment of the present invention. FIG. 18B is a cross-sectional view taken along the line I-I' of FIG. 18A; FIG. 19B is a cross-sectional view taken along the line I-I' of FIG. 19A; FIG. 20B is a cross-sectional view taken along the line I-I' of FIG. 20A; and FIG. 21B is a cross-sectional view taken along the line I-I' of FIG. 21A.

Figure 18A:
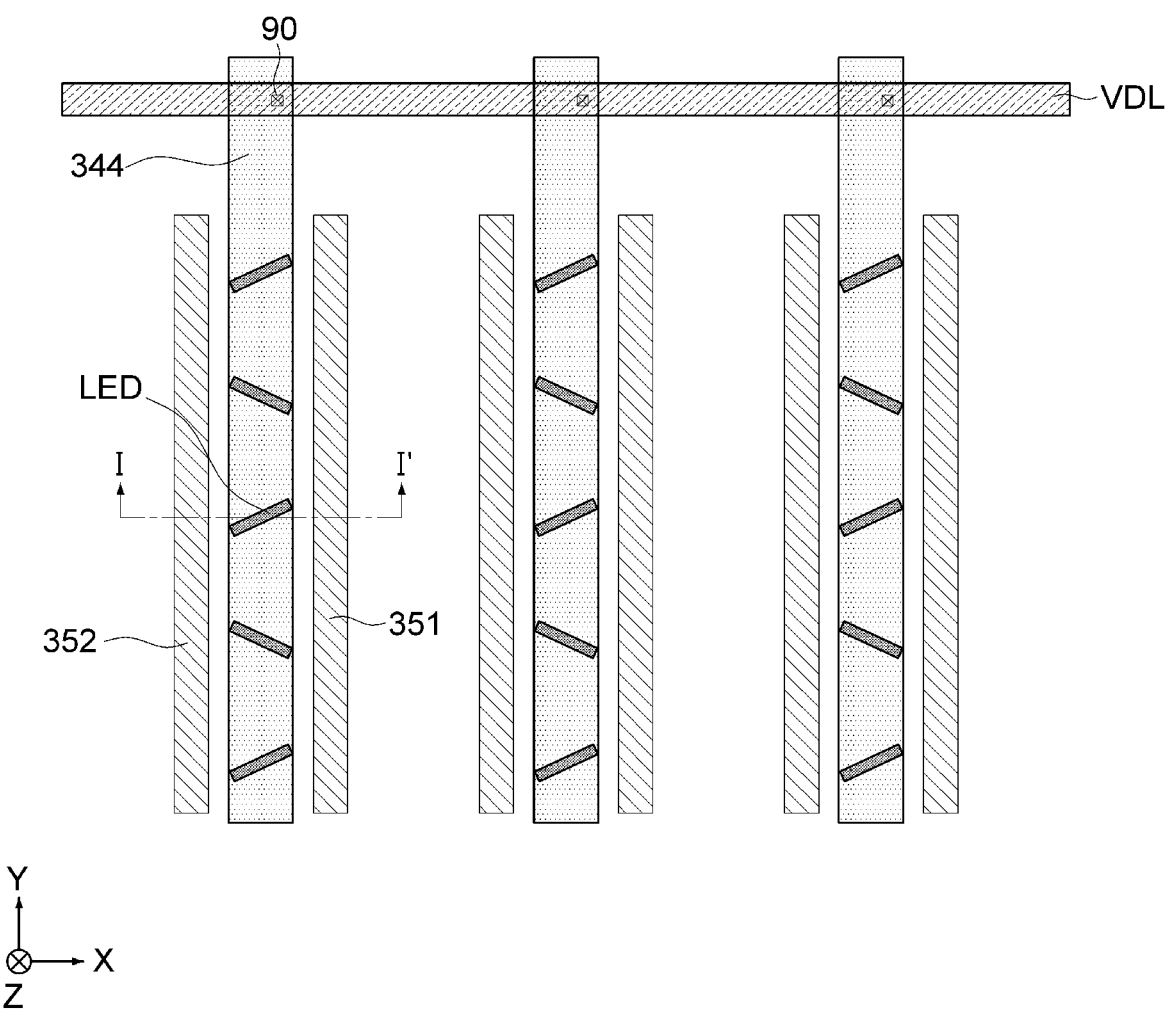
FIGS. 18A to 21B are diagrams for explaining a method of manufacturing a display device according to an embodiment of the present invention.
Figure 18B:
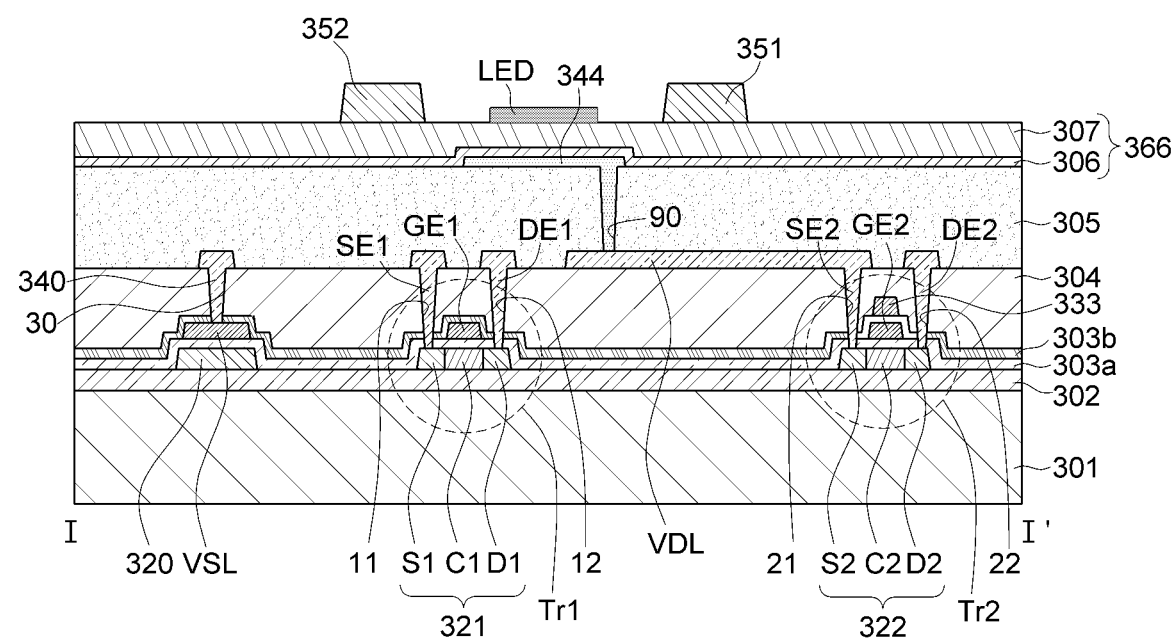

First, as illustrated in FIGS. 18A and 18B, the buffer layer 302, the dummy layer 320, the first semiconductor layer 321, the second semiconductor layer 322, the first gate insulating layer 303a, the second driving power line VSL, the first gate electrode GE1, the second gate electrode GE2, the second gate insulating layer 303b, the storage electrode 333, the insulating interlayer 304, the extension electrode 340, the first source electrode SE1, the first drain electrode DE1, the first driving power line VDL, the second source electrode SE2, the second drain electrode DE2, the planarization layer 305, the first insulating layer 306, the alignment electrode 344, the second insulating layer 307, the first driving electrode 351, the second driving electrode 352, and the LED are formed on the substrate 301. In an embodiment, the method of manufacturing the above-listed components is substantially the same as the method of manufacturing the components related to FIGS. 6A and 6B described above. However, the alignment electrode 344 of FIGS. 18A and 18B is connected to the first driving power line VDL through the contact hole 90 of the planarization layer 305. In an embodiment, the contact hole 90 may be defined by a photoresist process. In an embodiment, the alignment electrode 344 may be formed by a photoresist process, such as the first alignment electrode 341 and the second alignment electrode 342 of FIG. 6A described above.

Next, as illustrated in FIGS. 19A and 19B, an alignment signal Sa is applied to the first driving power line VDL. The alignment signal Sa applied to the first driving power line VDL is applied to each alignment electrode 344.

The alignment signal Sa may be, for example, the first driving voltage VDD which is a DC voltage.

An electric field is generated toward the LED by the alignment signal Sa applied to the alignment electrode 344, and the LEDs are aligned along one direction by the electric field. For example, the LEDs may be aligned such that their axes are parallel to the X axis, as illustrated in FIG. 19A.

Next, as illustrated in FIGS. 20A and 20B, part of the second insulating layer 307, the first insulating layer 306, and the planarization layer 305 is selectively removed, and, thus, the contact hole 60 exposing the second drain electrode DE2 and the contact hole 70 exposing the extension electrode 340 are defined. These contact holes 60 and 70 may be defined by a photoresist process. In an exemplary embodiment, the process of defining the contact holes 60 and 70 may be performed in the state in which the alignment signal Sa is applied.

Next, as illustrated in FIGS. 21A and 21B, the first connection electrode 371 is formed on the first electrode of the LED, the first driving electrode 351, and the second insulating layer 307, and the second connection electrode 372 is formed on the second electrode of the LED, the second driving electrode 352, and the second insulating layer 307. The first connection electrode 371 and the second connection electrode 372 may include substantially the same material. In an embodiment, the first connection electrode 371 and the second connection electrode 372 may be formed by a photoresist process.

The first connection electrode 371 is connected to the second drain electrode DE2 through the contact hole 60, and the second connection electrode 372 is connected to the extension electrode 340 through the contact hole 70.

In an exemplary embodiment, the first connection electrode 371 and the second connection electrode 372 may be formed in the state in which the alignment signal Sa is applied.

The alignment electrode 344 is connected to the first driving power line VDL. Accordingly, the first driving voltage VDD may be applied to the alignment electrode 344. Accordingly, the floating state of the alignment electrode 344 may be substantially prevented.

Figure 22:
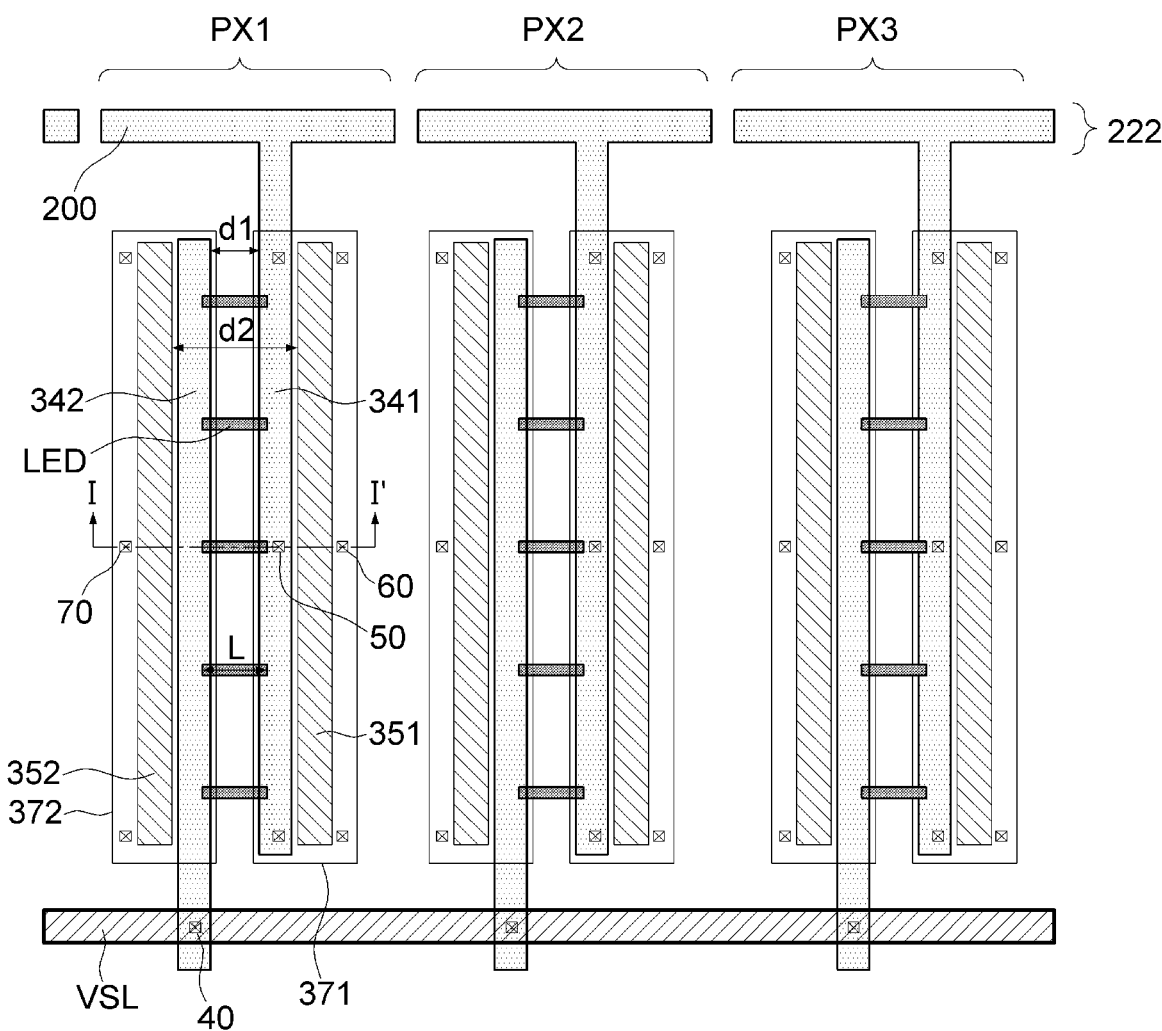
FIG. 22 is a plan view illustrating three adjacent pixels of a display device according to an embodiment of the present invention.
Figure 23:
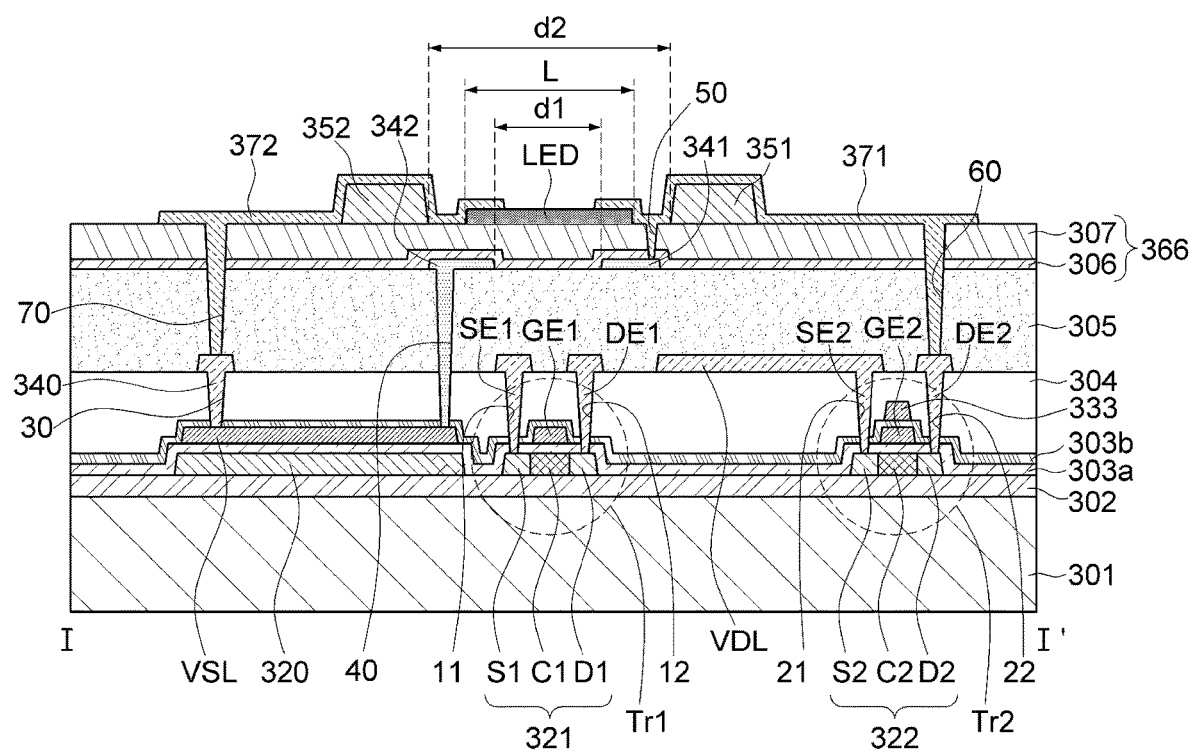
FIG. 23 is a cross-sectional view taken along the line I-I' of FIG. 22.

FIG. 22 is a plan view illustrating three adjacent pixels of a display device according to an embodiment of the present invention; and FIG. 23 is a cross-sectional view taken along the line I-I' of FIG. 22.

As illustrated in FIGS. 22 and 23, a display device according to an embodiment includes a substrate 301, a buffer layer 302, a dummy layer 320, a first switching element Tr1, a second switching element Tr2, a first gate insulating layer 303a, a second driving power line VSL, a second gate insulating layer 303b, a storage electrode 333, an insulating interlayer 304, a first driving power line VDL, a planarization layer 305, an insulating layer 366, a first alignment electrode 341, a second alignment electrode 342, a first driving electrode 351, a second driving electrode 352, an LED, a first connection electrode 371, and a second connection electrode 372.

The substrate 301, the buffer layer 302, the dummy layer 320, the first switching element Tr1, the second switching element Tr2, the first gate insulating layer 303a, the second driving power line VSL, the second gate insulating layer 303b, the storage electrode 333, the insulating interlayer 304, the first driving power line VDL, the planarization layer 305, the insulating layer 366, the first alignment electrode 341, the second alignment electrode 342, the first driving electrode 351, the second driving electrode 352, the LED, the first connection electrode 371, and the second connection electrode 372 of FIGS. 22 and 23 are substantially the same as the substrate 301, the buffer layer 302, the dummy layer 320, the first switching element Tr1, the second switching element Tr2, the first gate insulating layer 303a, the second driving power line VSL, the second gate insulating layer 303b, the storage electrode 333, the insulating interlayer 304, the first driving power line VDL, the planarization layer 305, the insulating layer 366, the first alignment electrode 341, the second alignment electrode 342, the first driving electrode 351, the second driving electrode 352, the LED, the first connection electrode 371, and the second connection electrode 372 of FIGS. 3 and 4, respectively.

However, in an embodiment, as illustrated in FIGS. 22 and 23, a distance dl between the first alignment electrode 341 and the second alignment electrode 342 may be less than a length L of the LED.

As illustrated in FIGS. 22 and 23, the first alignment electrode 341 may overlap the third side surface of the LED, and the second alignment electrode 342 may overlap the fourth side surface of the LED.

As illustrated in FIGS. 22 and 23, the first driving electrode 351 and the first alignment electrode 341 may not overlap each other, and the second driving electrode 352 and the second alignment electrode 342 may not overlap each other.

In one or more embodiments, the LED, the first alignment electrode 341, the second alignment electrode 342, the first driving electrode 351, and the second driving electrode 352 of FIGS. 3, 10, and 16 may have the structure substantially the same as the structure of the LED, the first alignment electrode 341, the second alignment electrode 342, the first driving electrode 351, and the second driving electrode 352 of FIGS. 22 and 23. For example, the distance dl between the first alignment electrode 341 and the second alignment electrode 342 of FIG. 10 may be less than the length L of the LED. In addition, the first alignment electrode 341 of FIG. 10 may overlap the third side surface of the LED, and the second alignment electrode 342 of FIG. 10 may overlap the fourth side surface of the LED. In addition, the first driving electrode 351 and the first alignment electrode 341 of FIG. 10 may not overlap each other, and the second driving electrode 352 and the second alignment electrode 342 of FIG. 10 may not overlap each other.

In an exemplary embodiment, the method of manufacturing the display device of FIGS. 22 and 23 is substantially the same as the method of manufacturing the display device of FIGS. 6A to 9B described above.

As set forth herein, the display device according to one or more embodiments of the present invention may provide the following effects.

The display device includes an alignment electrode for aligning LEDs. Accordingly, the degree of alignment of the LEDs may be improved.

In addition, since the voltage necessary to drive the display device is applied to the alignment electrode after the alignment process, the floating state of the alignment electrode may be prevented or substantially prevented.

In addition, the alignment electrode may reflect the light emitted from the LED, and thus the luminous efficiency may be improved.

While the present invention has been illustrated and described with reference to some embodiments thereof, it will be apparent to those of ordinary skill in the art that various changes in form and detail may be formed thereto without departing from the spirit and scope of the present invention.

What is claimed is:

1. A display device comprising:
a substrate;
a switching element on the substrate;
a first insulating layer on the switching element;
a first alignment electrode and a second alignment electrode disposed on the first insulating layer so as to face each other along a first direction;
a second insulating layer on the first alignment electrode and the second alignment electrode;
a first driving electrode on the second insulating layer and connected to the switching element;
a second driving electrode disposed on the second insulating layer so as to face the first driving electrode along the first direction; and
a light emitting element between the first driving electrode and the second driving electrode,
wherein a distance between the first alignment electrode and the second alignment electrode is less than a distance between the first driving electrode and the second driving electrode, and
wherein a first side surface of the first alignment electrode and a second side surface of the second alignment electrode that faces the first side surface along the first direction overlap an area between the first driving electrode and the second driving electrode in a direction crossing the first direction.

2. The display device of claim 1, wherein the first side surface and the second side surface overlap the light emitting element.

3. The display device of claim 2, wherein a first side surface and a second side surface of the light emitting element face each other, and the first side surface of the light emitting element overlaps the first side surface of the first alignment electrode.

4. The display device of claim 3, wherein the second side surface of the light emitting element overlaps the second side surface of the second alignment electrode.

5. The display device of claim 1, wherein the distance between the first alignment electrode and the second alignment electrode is equal to or less than a length of the light emitting element.

6. The display device of claim 1, wherein the first driving electrode overlaps the first alignment electrode, and the second driving electrode overlaps the second alignment electrode.

7. The display device of claim 1, wherein the first alignment electrode is connected to the switching element, the first driving electrode, and a first electrode of the light emitting element.

8. The display device of claim 7, further comprising a driving power line connected to the second alignment electrode.

9. The display device of claim 8, wherein the driving power line is connected to the second driving electrode and a second electrode of the light emitting element.

10. The display device of claim 1, further comprising an alignment line connected to the first alignment electrode.

11. The display device of claim 10, wherein the alignment line has a non-continuous line shape.

12. The display device of claim 1, further comprising a first driving power line between the first insulating layer and the substrate and connected to the first alignment electrode; and
a second driving power line between the first insulating layer and the substrate and connected to the second alignment electrode, wherein a voltage of the second driving power line is lower than a voltage of the first driving power line.

13. The display device of claim 1, wherein the light emitting element comprises a first semiconductor layer, a second semiconductor layer, and a light emitting layer between the first semiconductor layer and the second semiconductor layer, and
the first semiconductor layer, the light emitting layer, and the second semiconductor layer are sequentially disposed in a direction parallel to an upper surface of the substrate.

14. A display device comprising:
a substrate;
a switching element on the substrate;
a first insulating layer on the switching element;
an alignment electrode on the first insulating layer;
a second insulating layer on the alignment electrode;
a first driving electrode on the second insulating layer and connected to the switching element;
a second driving electrode disposed on the second insulating layer so as to face the first driving electrode along a first direction; and
a light emitting element between the first driving electrode and the second driving electrode,
wherein facing side surfaces of the alignment electrode overlap an area between the first driving electrode and the second driving electrode in a direction crossing the first direction.

15. The display device of claim 14, wherein a distance between the facing side surfaces of the alignment electrode is less than a distance between the first driving electrode and the second driving electrode.

16. The display device of claim 14, wherein a distance between the facing side surfaces of the alignment electrode is equal to or larger than a distance between facing side surfaces of the light emitting element.

17. The display device of claim 14, wherein the light emitting element comprises a first semiconductor layer, a second semiconductor layer, and a light emitting layer between the first semiconductor layer and the second semiconductor layer, and
the first semiconductor layer, the light emitting layer, and the second semiconductor layer are sequentially disposed in a direction parallel to an upper surface of the substrate.

18. The display device of claim 14, further comprising a first driving power line between the first insulating layer and the substrate and connected to the first alignment electrode.

19. The display device of claim 14, wherein the alignment electrode overlaps the light emitting element in the first direction, and does not overlap the first driving electrode and the second driving electrode.

20. A method of manufacturing a display device, the method comprising:
forming a switching element on a substrate;
forming a first insulating layer on the switching element;
forming a first alignment electrode and a second alignment electrode that face each other along a first direction on the first insulating layer;
forming a second insulating layer on the first alignment electrode and the second alignment electrode;
forming a first driving electrode and a second driving electrode that face each other along the first direction on the second insulating layer;
forming a light emitting element between the first driving electrode and the second driving electrode; and
applying a first alignment signal to the first alignment electrode, and applying a second alignment signal to the second alignment electrode,
wherein a first side surface of the first alignment electrode and a second side surface of the second alignment electrode that faces the first side surface overlap an area between the first driving electrode and the second driving electrode in a direction crossing the first direction.

21. The method of claim 20, wherein the second alignment signal is a DC voltage, and
the first alignment signal is an AC signal having a high voltage and a low voltage alternately, the high voltage being higher than the second alignment signal, and the low voltage being lower than the second alignment signal.

22. The method of claim 20, further comprising:
forming an alignment line on the first insulating layer, the alignment line connected to the first alignment electrode; and
disconnecting a part of the alignment line after applying the first alignment signal and the second alignment signal.

* * * * *